(12) United States Patent
Kojo et al.

(10) Patent No.: US 10,771,037 B2
(45) Date of Patent: Sep. 8, 2020

(54) PIEZOELECTRIC RESONATOR DEVICE

(71) Applicant: Daishinku Corporation, Kakogawa-shi, Hyogo (JP)

(72) Inventors: Takuya Kojo, Kakogawa (JP); Satoru Ishino, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 301 days.

(21) Appl. No.: 15/561,037

(22) PCT Filed: Feb. 5, 2016

(86) PCT No.: PCT/JP2016/053579
§ 371 (c)(1),
(2) Date: Sep. 23, 2017

(87) PCT Pub. No.: WO2016/158010
PCT Pub. Date: Oct. 6, 2016

(65) Prior Publication Data
US 2018/0076790 A1    Mar. 15, 2018

(30) Foreign Application Priority Data
Mar. 27, 2015  (JP) .................................. 2015-065972

(51) Int. Cl.
*H03H 9/02*     (2006.01)
*H01L 23/04*    (2006.01)
(Continued)

(52) U.S. Cl.
CPC ......... *H03H 9/02015* (2013.01); *H01L 23/04* (2013.01); *H01L 41/0477* (2013.01);
(Continued)

(58) Field of Classification Search
CPC .. H03H 9/02015; H03H 9/173; H03H 9/1035; H03H 9/0595; H03H 9/0547;
(Continued)

(56) References Cited

U.S. PATENT DOCUMENTS

| 2008/0079334 A1 | 4/2008 | Yong et al. |
| 2009/0153257 A1 | 6/2009 | Matsuo |

(Continued)

FOREIGN PATENT DOCUMENTS

| JP | 03-151704 A | 6/1991 |
| JP | 2000-223996 A | 8/2000 |

(Continued)

*Primary Examiner* — Bryan P Gordon
(74) *Attorney, Agent, or Firm* — Marvin Motsenbocker

(57) ABSTRACT

A piezoelectric resonator device having a sandwich structure is provided, which is stably bonded to an external element. In the piezoelectric resonator device 1, at least a vibrating part 21 of a piezoelectric substrate 2 is sealed by a first sealing member 3 and a second sealing member 4. The piezoelectric substrate 2 includes: the vibrating part 21; and an external frame part 23 that is thicker than the vibrating part 21 and that surrounds the outer periphery of the vibrating part 21. External electrodes 31 to be connected to an external element 5 are provided on at least one of the first sealing member 3 and the second sealing member 4. The external element 5 is connected to the external electrodes 31 at least on the external frame part 23 of the piezoelectric substrate 2.

12 Claims, 13 Drawing Sheets

(51) Int. Cl.
  *H03H 9/05*     (2006.01)
  *H03H 9/10*     (2006.01)
  *H01L 41/047*   (2006.01)
  *H01L 41/316*   (2013.01)
  *H01L 41/319*   (2013.01)
  *H03H 9/17*     (2006.01)

(52) U.S. Cl.
  CPC .......... *H01L 41/316* (2013.01); *H01L 41/319* (2013.01); *H03H 9/0547* (2013.01); *H03H 9/0595* (2013.01); *H03H 9/1035* (2013.01); *H03H 9/173* (2013.01)

(58) Field of Classification Search
  CPC . H01L 41/0477; H01L 41/316; H01L 41/319; H01L 23/04
  See application file for complete search history.

(56) References Cited

U.S. PATENT DOCUMENTS

| | | |
|---|---|---|
| 2013/0043770 A1 | 2/2013 | Mizusawa |
| 2013/0257549 A1 | 10/2013 | Asamura |
| 2016/0260886 A1* | 9/2016 | Kohda .................... H03H 9/19 |

FOREIGN PATENT DOCUMENTS

| | | |
|---|---|---|
| JP | 2006-094372 A | 4/2006 |
| JP | 2008-160603 A | 7/2008 |
| JP | 2009-130665 A | 6/2009 |
| JP | 2009-165102 A | 7/2009 |
| JP | 2010-252051 A | 11/2010 |
| JP | 2013-042388 A | 2/2013 |
| JP | 2013-046127 A | 3/2013 |
| JP | 2013-207686 A | 10/2013 |

* cited by examiner

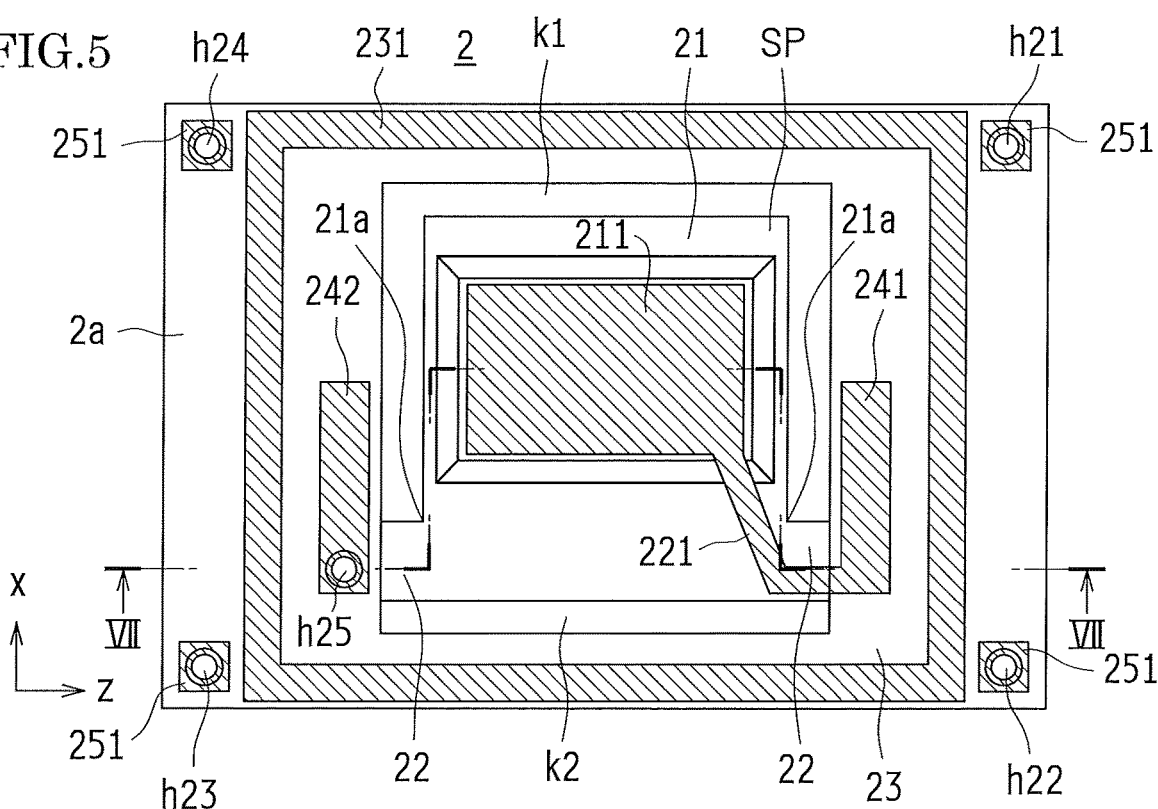
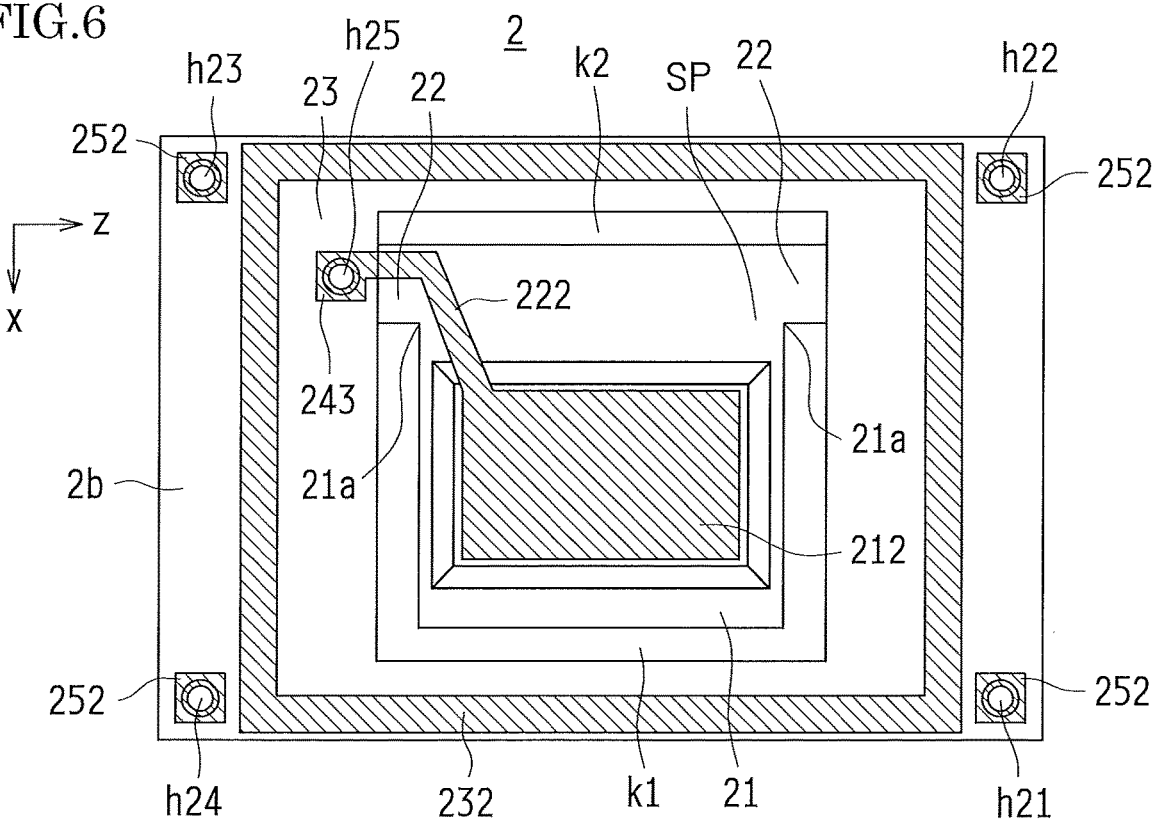

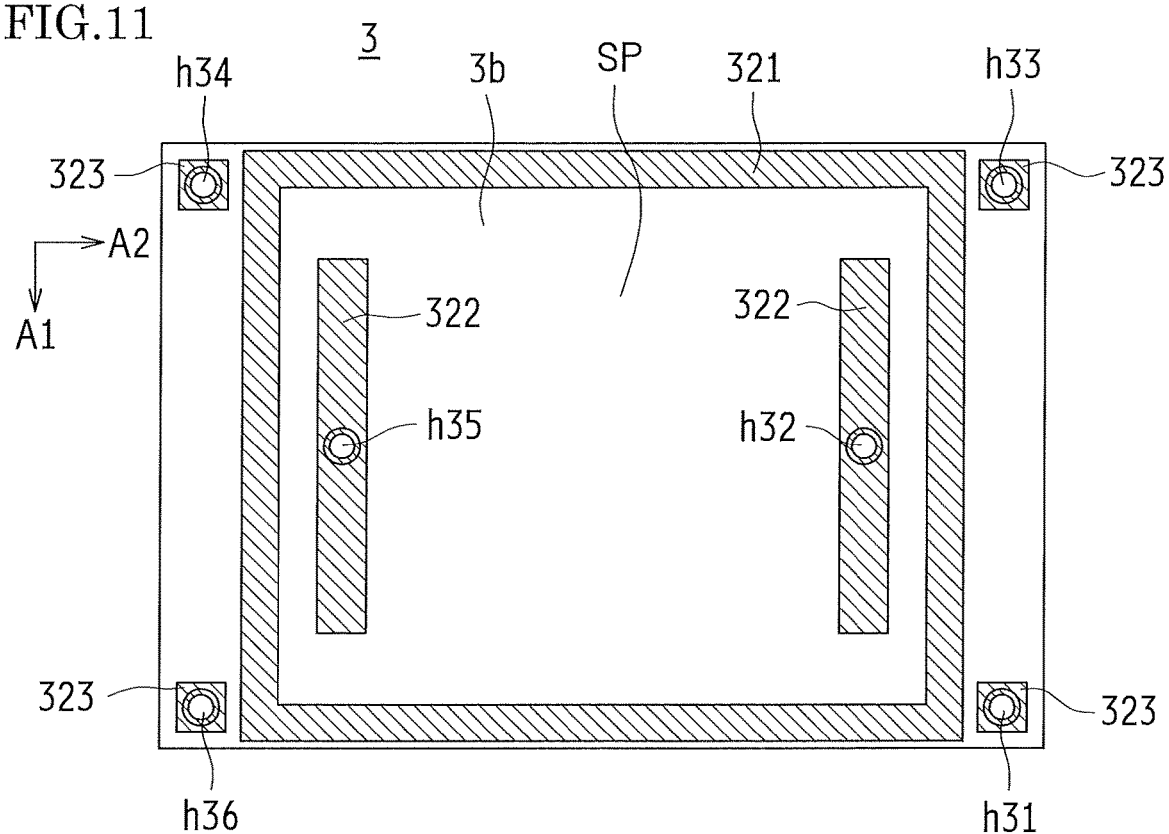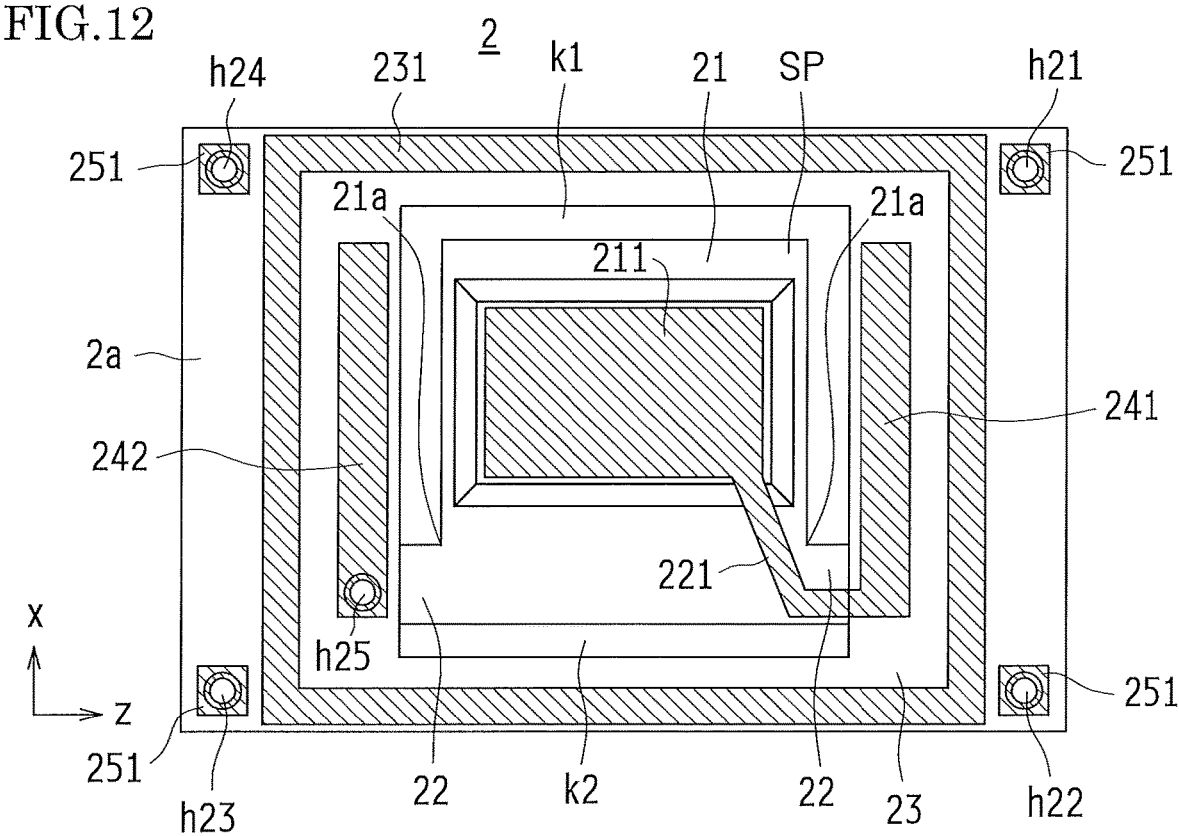

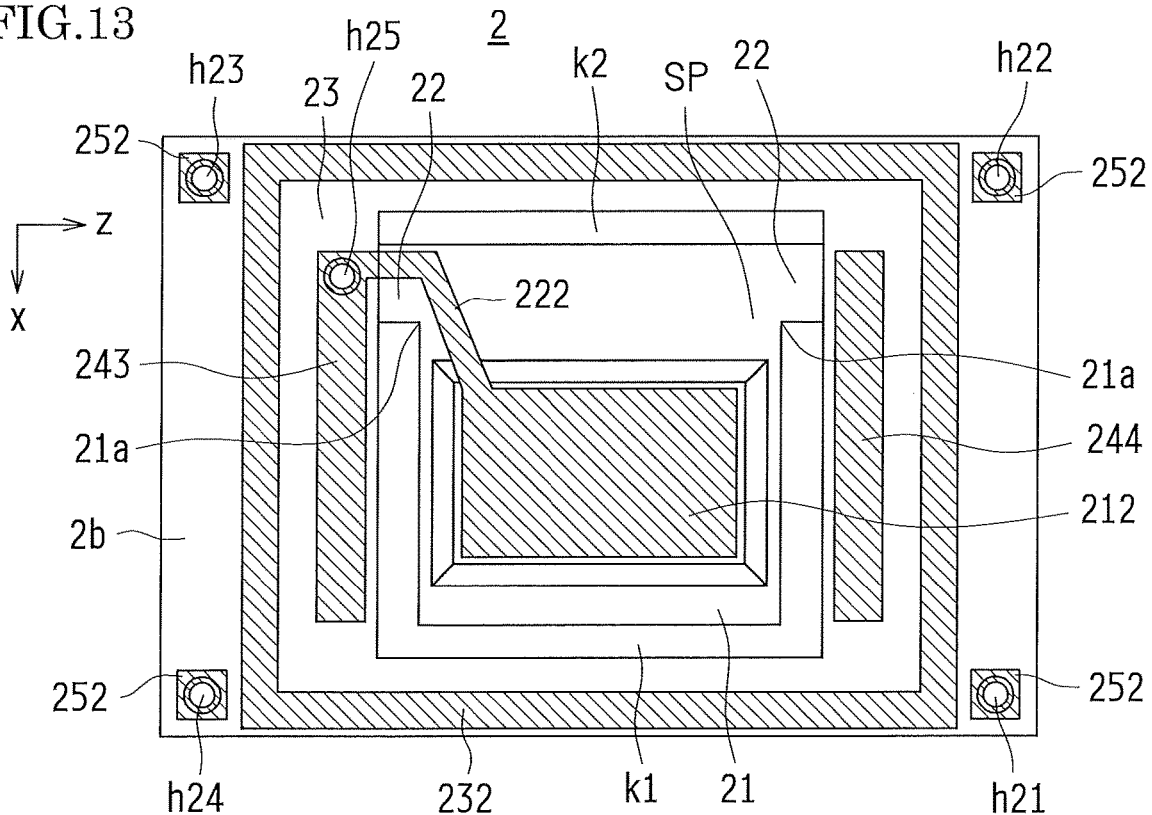
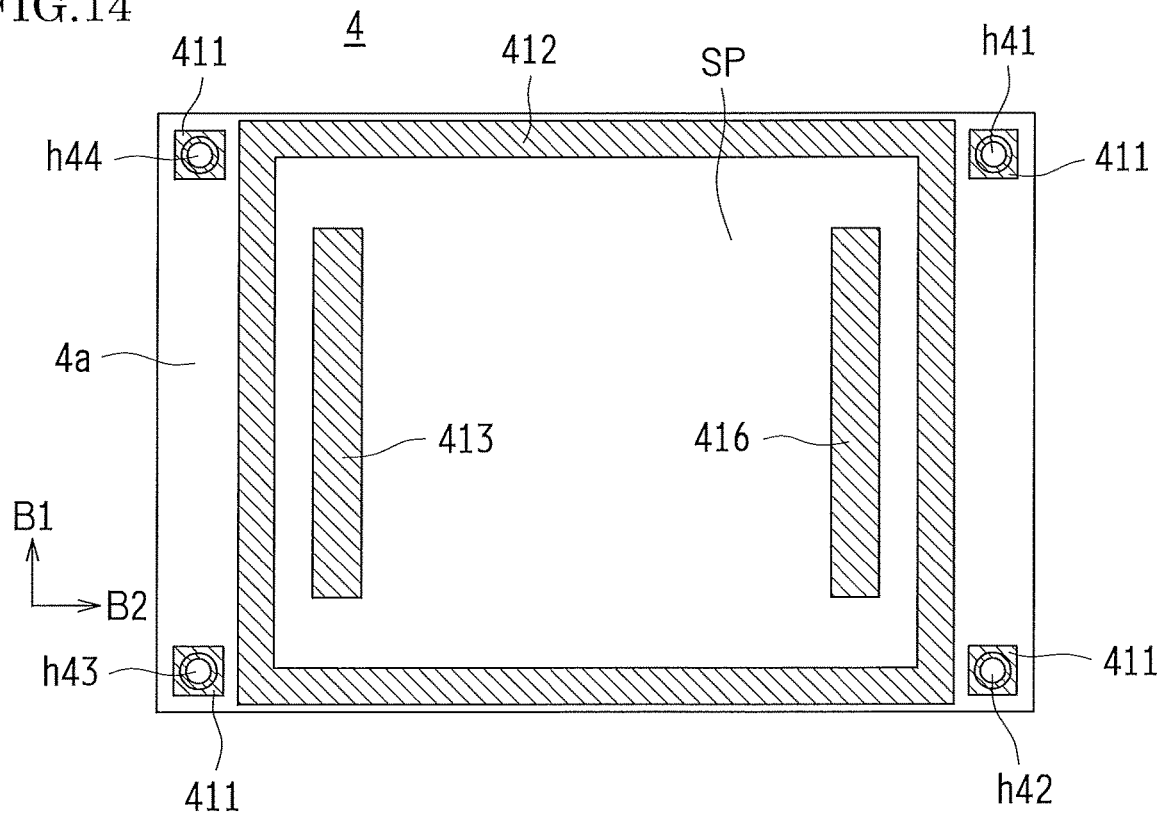

PIEZOELECTRIC RESONATOR DEVICE

TECHNICAL FIELD

The present invention relates to piezoelectric resonator devices.

BACKGROUND ART

Recent years, in various electronic devices, their operating frequencies have increased and their packages (especially, their heights) have been downsized. According to such an increase in operating frequency and a reduction in package size, there is also a need for piezoelectric resonator devices (crystal resonators, for example) to be adaptable to the increase in operating frequency and the reduction in package size.

In this kind of piezoelectric resonator, a housing is constituted by a rectangular-shaped package. The package is constituted by: a first sealing member and a second sealing member both made of glass or crystal; and a crystal resonator plate made of crystal. On both main surfaces of the crystal resonator plate, respective excitation electrodes are formed. The first sealing member and the second sealing member are laminated and bonded via the crystal resonator plate. Thus, the excitation electrodes of the crystal resonator plate that is disposed in the package (in the internal space) are hermetically sealed (for example, see Patent Document 1). Hereinafter, such a laminated structure of the piezoelectric resonator is referred to as a sandwich structure.

Meanwhile, Patent Document 2 discloses a crystal oscillator constituted by a semiconductor oscillation circuit element and a crystal resonator that are sealed in one package. In the crystal oscillator, patterns are formed on one surface of the crystal resonator so as to fit a semiconductor oscillation circuit element on one pattern. Also, a bonding pad of the semiconductor oscillation circuit element is electrically connected to the patterns of the crystal resonator.

PRIOR ART DOCUMENTS

Patent Documents

[Patent Document 1] JP 2010-252051 A
[Patent Document 2] JP 1103-151704 A

SUMMARY OF INVENTION

Problem to Be Solved by the Invention

In manufacture of a piezoelectric resonator device by fitting the semiconductor oscillation circuit element of Patent Document 2 on the piezoelectric resonator of Patent Document 1, there may occur problems described below because the semiconductor oscillation circuit element (external element) is pressed against the piezoelectric resonator so as to be fitted on the piezoelectric resonator: a stable connection of the external element is prevented due to a first sealing member or a second sealing member bending inside by the pressure; and the crystal resonator is broken due to contact of the crystal resonator with the first sealing member or the second sealing member by the pressure.

The present invention was made in consideration of the above circumstances, an object of which is to provide a piezoelectric resonator device having a sandwich structure that is capable of being stably connected to an external element.

Means for Solving the Problem

In order to achieve the above object, the present invention has a configuration as stated below.

A piezoelectric resonator device of the present invention includes: a piezoelectric substrate including a vibrating part configured to piezoelectrically vibrate by application of a voltage; a first sealing member covering a first main surface of the piezoelectric substrate so as to seal the vibrating part; and a second sealing member covering a second main surface of the piezoelectric substrate so as to seal the vibrating part. The piezoelectric resonator device is configured to seal at least the vibrating part of the piezoelectric substrate by the first sealing member and the second sealing member. The piezoelectric substrate includes: the vibrating part; and an external frame part configured to be thicker than the vibrating part and to surround an outer periphery of the vibrating part. External electrodes, which are to be connected to an external element, are provided at least on one of the first sealing member and the second sealing member. The external element is connected to the external electrodes at least on the external frame part of the piezoelectric substrate. The external electrodes mean the electrodes formed on the surface of the first sealing member or the second sealing member, the surface on which the external element is to be mounded.

In the above-described configuration, the external element is connected to the external electrodes of at least one of the first sealing member and the second sealing member at least on the external frame part that is thicker than the vibrating part and that surrounds the outer periphery of the vibrating part of the piezoelectric substrate. Thus, even when the external element is pressed, the inside of a sealed region in which the vibrating part is sealed can be prevented from being pressed. Accordingly, it is possible to stably bond the external element.

In the above-described piezoelectric resonator device, the external electrodes are connected to the external element via metal bumps.

In the above-described configuration, the metal bumps to be connected to the external element are provided on the first sealing member or the second sealing member, at respective positions corresponding to the external frame part. Thus, even when the external element is pressed at the time of flip chip bonding, it is possible to prevent the inside of the external frame part from bending. Also, since the inside of the external frame part is not likely to bend even when the external element is connected using the metal bumps, the external element can be bonded stably. Also, it is possible to prevent the first sealing member or the second sealing member from making contact with the crystal resonator (vibrating part).

In the above-described piezoelectric resonator device, the external electrodes include at least an external electrode for a first excitation electrode and an external electrode for a second excitation electrode connected respectively to a pair of first excitation electrode and second excitation electrode formed on the vibrating part of the piezoelectric substrate. Only the metal bump connecting the external electrode for the first excitation electrode to the external element is disposed at a position superimposed to a first wiring connecting the first excitation electrode to the external electrode for the first excitation electrode in plan view. Only the metal bump connecting the external electrode for the second excitation electrode to the external element is disposed at a position superimposed to a wiring connecting the second excitation electrode to the external electrode for the second excitation electrode in plan view.

In the above-described configuration, the metal bumps that are respectively connected to the excitation electrodes (the first excitation electrode and the second excitation electrode) are not superimposed, in plan view, to the wirings (the second wiring and the first wiring) respectively connected to the excitation electrodes with different polarity from those connected to the metal bumps (i.e. the second excitation electrode and the first excitation electrode). In addition to the above, the metal bumps that are not connected to the excitation electrodes (the first excitation electrode and the second excitation electrode) are not superimposed, in plan view, to the wirings (the first wiring and the second wiring) that are connected to the excitation electrodes. In this way, it is possible to reduce the parasitic capacity caused by superposition of the metal bump and the wiring respectively connected to the excitation electrodes with different polarity, and to reduce the parasitic capacity caused by superposition of the metal bumps that are not connected to the excitation electrodes and the wirings that are connected to the excitation electrodes.

In the above-described piezoelectric resonator device, the external electrodes include, at least: the external electrode for the first excitation electrode and the external electrode for the second excitation electrode connected respectively to the pair of the first excitation electrode and the second excitation electrode formed on the vibrating part of the piezoelectric substrate; and the other electrodes not connected to the first excitation electrode and the second excitation electrode. The other external electrodes are disposed at positions not superimposed, in plan view, to: the first wiring connecting the first excitation electrode to the external electrode for the first excitation electrode; and the second wiring connecting the second excitation electrode to the external electrode for the second excitation electrode.

With the above-described configuration, it is possible to reduce the parasitic capacity caused by superposition of the other external electrodes and the wirings (the first wiring and the second wiring) connected to the excitation electrodes (the first excitation electrode and the second excitation electrode).

In the above-described piezoelectric resonator device, the external electrode for the first excitation electrode is disposed at a position not superimposed to the second wiring in plan view, and the external electrode for the second excitation electrode is disposed at a position not superimposed to the first wiring in plan view.

With the above-described configuration, it is possible to reduce the parasitic capacity caused by superposition of the external electrodes (the external electrode for the first excitation electrode and the external electrode for the second excitation electrode) connected to the excitation electrodes (the first excitation electrode and the second excitation electrode) and the wirings (the second wiring and the first wiring) connected to the excitation electrodes (the second excitation electrode and the first excitation electrode) with different polarity from those connected to the external electrodes.

In the above-described piezoelectric resonator device, the external electrode for the first excitation electrode and the external electrode for the second excitation electrode are formed at respective positions corresponding to the external frame part of the piezoelectric substrate in plan view, and the external electrode for the first excitation electrode and the external electrode for the second excitation electrode are used as test terminals for the vibrating part of the piezoelectric substrate.

In the above-described configuration, the external electrode for the first excitation electrode and the external electrode for the second excitation electrode are used as the test terminals. Thus, it is possible to distribute, from the first sealing member to the piezoelectric substrate, the pressure when the inspection probe makes contact with the test terminal, which leads to prevention of deformation of the first sealing member. In this way, it is possible to prevent the block of the piezoelectric vibration of the vibrating part of the piezoelectric substrate or to suppress the change in the stray capacity, both of which are caused by deformation of the first sealing member.

In the above-described piezoelectric resonator device, the external electrodes are formed on the first sealing member, and the external element is an IC.

With the above-describe configuration, it is possible to provide the piezoelectric resonator device such as a piezoelectric oscillator having an IC capable of obtaining stable piezoelectric properties.

In the above-described piezoelectric resonator device, in which are formed the excitation electrodes configured to piezoelectrocally vibrate by application of a voltage on both surfaces of the vibrating part, it is preferable that the external electrodes of the first sealing member or the second sealing member are not superimposed to the excitation electrodes in plan view.

In the above-described configuration, each external electrode of the first sealing member or the second sealing member has a small area that is superimposed to the excitation electrodes in plan view. Thus, it is possible to reduce the parasitic capacity between the external electrodes and the excitation electrodes.

In the above-described piezoelectric resonator device, it is preferable that connection electrodes are formed on either or both of the first sealing member and the second sealing member so as to be connected to the excitation electrodes. Also, it is preferable that the connection electrodes are formed inside the external frame part and are not superimposed to the vibrating part in plan view.

In the above-described configuration, each of the connection electrodes to be connected to the excitation electrodes has a small area that is superimposed to the vibrating part in plan view. Thus, it is possible to reduce the parasitic capacity between the connection electrodes and the excitation electrodes formed on the vibrating part.

Effects of the Invention

With the present invention, a piezoelectric resonator device having a sandwich structure can be stably connected to an external element.

BRIEF DESCRIPTION OF THE DRAWINGS

FIG. 5 is a schematic plan view of a piezoelectric substrate of the piezoelectric resonator device according to the embodiment of the present invention.

FIG. 6 is a schematic rear view of the piezoelectric substrate of the piezoelectric resonator device according to the embodiment of the present invention.

FIG. 11 is a schematic rear view illustrating a variation of the first sealing member of the piezoelectric resonator device.

FIG. 12 is a schematic plan view illustrating the variation of the piezoelectric substrate of the piezoelectric resonator device.

FIG. 13 is a schematic rear view illustrating the variation of the piezoelectric substrate of the piezoelectric resonator device.

FIG. 14 is a schematic plan view illustrating the variation of the second sealing member of the piezoelectric resonator device.

MEANS FOR CARRYING OUT THE INVENTION

Hereinafter, a description will be given on embodiments of a piezoelectric resonator device of the present invention. The description of the embodiments will be given on the subject matters in the order of: the configuration of the piezoelectric resonator device; the method for manufacturing the piezoelectric resonator device; and functions and effects of the piezoelectric resonator device.

Configuration of Piezoelectric Resonator Device

Figure 1:
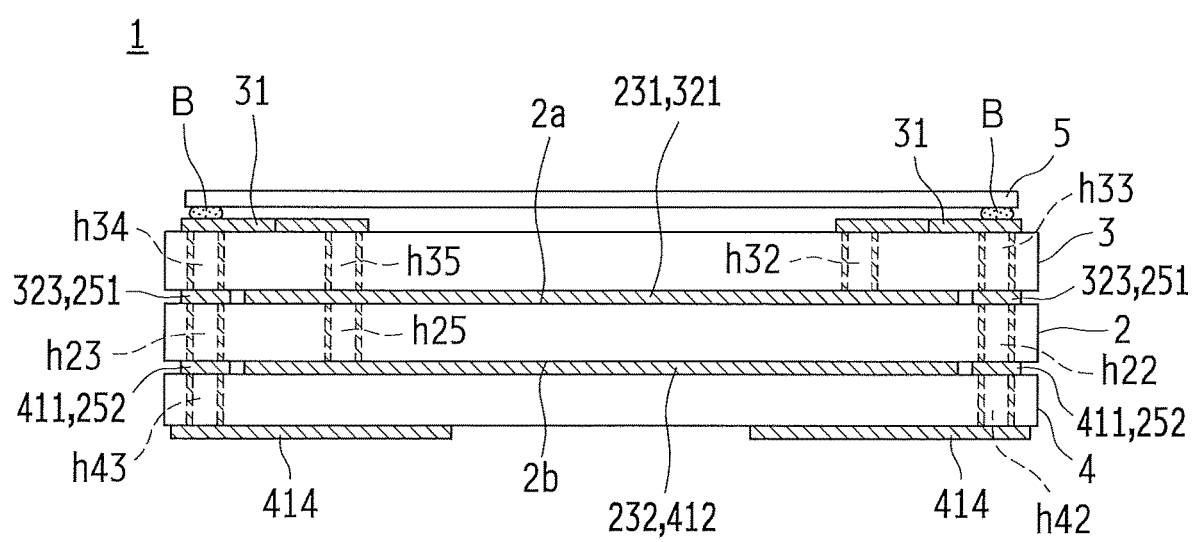
FIG. 1 is a schematic configuration diagram illustrating a configuration of a piezoelectric resonator device according to an embodiment of the present invention.
Figure 2:
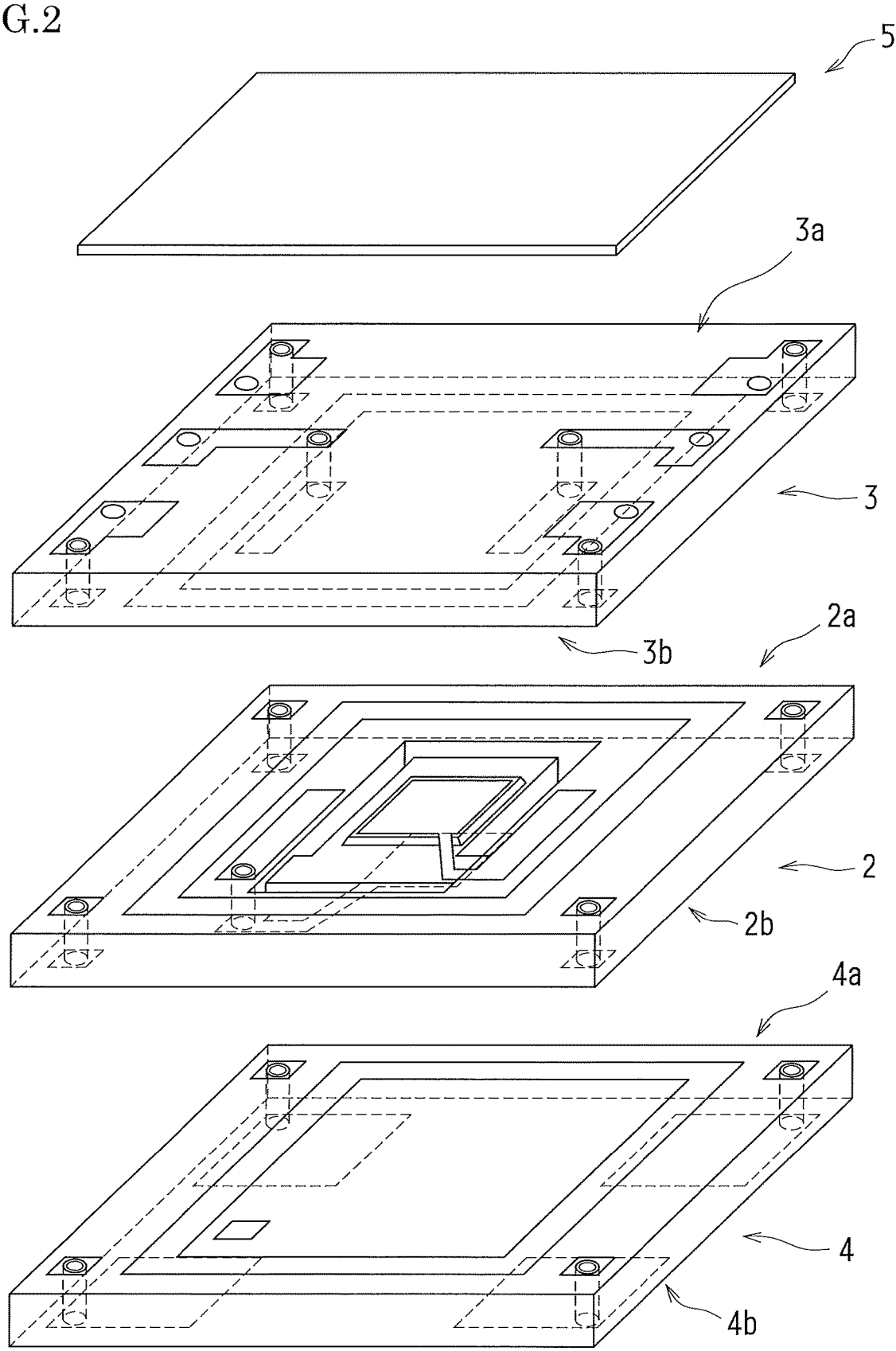
FIG. 2 is an exploded perspective view illustrating each component of the piezoelectric resonator device according to the embodiment of the present invention.

The configuration of a piezoelectric resonator device 1 of the present invention is described with reference to FIGS. 1 and 2. FIG. 1 is a schematic configuration diagram illustrating the configuration of the piezoelectric resonator device 1. FIG. 2 is an exploded perspective view illustrating each component of the piezoelectric resonator device.

The piezoelectric resonator device 1 of the present invention is, for example, a crystal oscillator that includes: a piezoelectric substrate 2; a first sealing member 3 covering and hermetically sealing a first main surface 2a of the piezoelectric substrate 2; a second sealing member 4 covering and hermetically sealing a second main surface 2b of the piezoelectric substrate 2; and an external element 5 that is other than the piezoelectric resonator element and that is mounted on the first sealing member 3. In the crystal oscillator, the piezoelectric substrate 2 is bonded to the first sealing member 3, and furthermore the piezoelectric substrate 2 is bonded to the second sealing member 4 (see FIG. 1).

That is, the piezoelectric resonator device 1 has a sandwich structure in which an internal space SP between the first sealing member 3 and the piezoelectric substrate 2 (see FIGS. 4 and 5) is hermetically sealed and also the internal space SP between the piezoelectric substrate 2 and the second sealing member 4 (see FIGS. 6 and 7) is hermetically sealed.

The piezoelectric resonator device 1 (crystal oscillator) has a package size of 1.2×1.0 mm, which is reduced in size and height. According to the size reduction, no castellation is formed in the piezoelectric resonator device 1. Through holes (first through fifteenth through holes h31 through h44) described later are used for conduction between electrodes.

Hereinafter, each component is described in detail.

First Sealing Member

Figure 3:
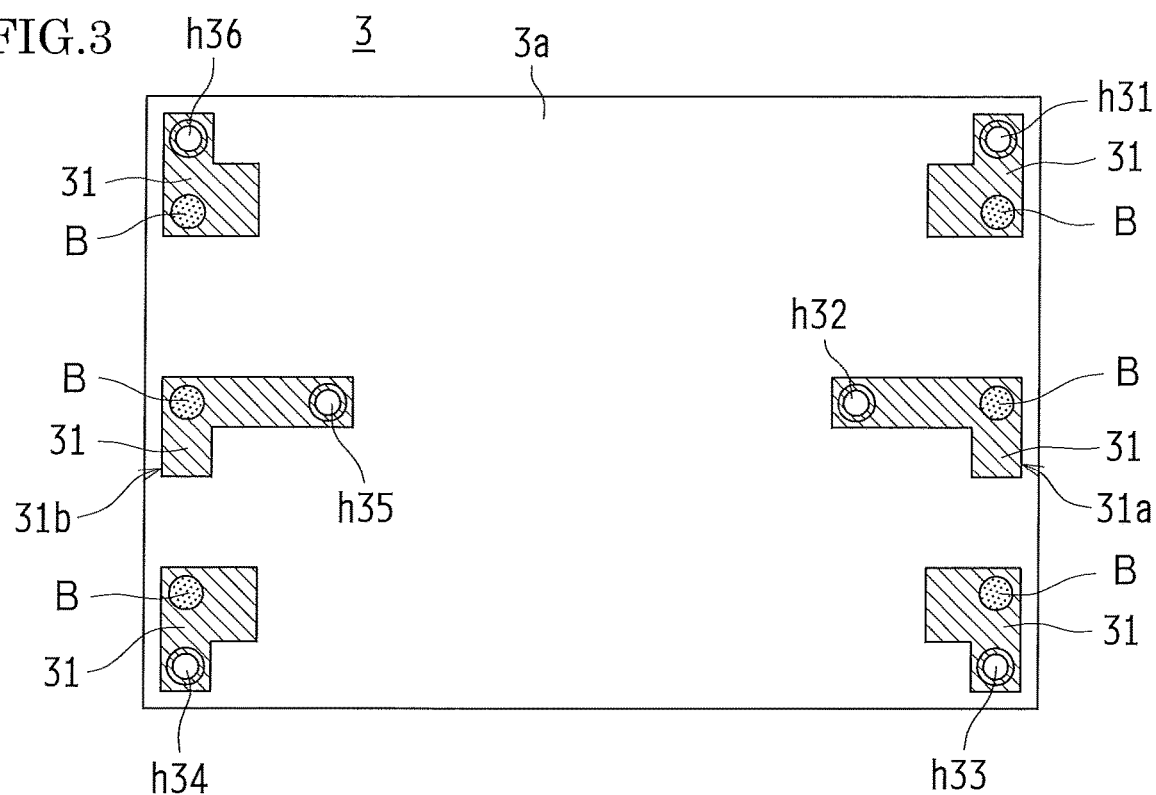
FIG. 3 is a schematic plan view illustrating a first sealing member of the piezoelectric resonator device according to the embodiment of the present invention.
Figure 4:
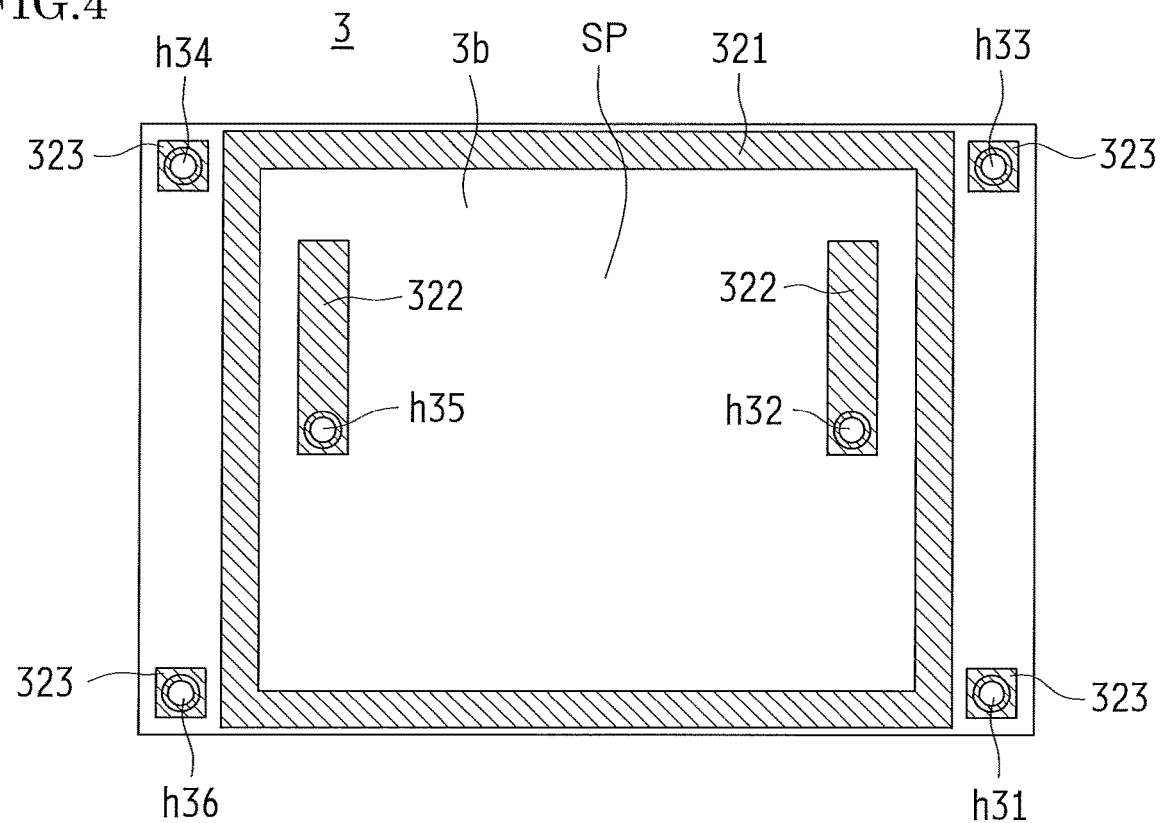
FIG. 4 is a schematic rear view illustrating the first sealing member of the piezoelectric resonator device according to the embodiment of the present invention.

The first sealing member of the piezoelectric resonator device is described with reference to FIGS. 3 and 4. FIG. 3 is a schematic plan view illustrating the first sealing member of the piezoelectric resonator device, and FIG. 4 is a schematic rear view illustrating the first sealing member of the piezoelectric resonator device.

The first sealing member 3 is made of a material having the flexural rigidity (moment of inertia of area× Young's modulus) of not more than 1000 [N·mm$^2$]. Specifically, as shown in FIGS. 3 and 4, the first sealing member 3 is a substrate having a rectangular parallelepiped shape that is made of a single glass wafer or a single crystal wafer. The first sealing member 3 includes a first main surface 3a as an upper surface, and a second main surface 3b (a surface to be bonded to the piezoelectric substrate 2) formed as a smooth flat surface (mirror finished).

As shown in FIG. 3, the first sealing member 3 is provided with, on the first main surface 3a, six external electrodes 31 on which an IC as the oscillation circuit element (see the external element 5 in FIG. 1) is mounted. A bonding material B is used to bond the IC to the external electrodes. In this embodiment, a metal bump such as Au bump is used as the bonding material B, but the bonding material B is not limited thereto.

Each position to be connected to the IC on the six external electrodes 31 (i.e. the position on which the bonding material B is disposed) is a position corresponding to an external frame part 23 of the piezoelectric substrate 2, which is described later. The position corresponding to the external frame part 23 is a position superimposed partially or completely to the external frame part 23 in plan view.

The first through sixth through holes h31 through h36 are respectively formed in the six external electrodes 31. Inside the through holes, respective electrodes are formed so as to establish electrical conduction.

As shown in FIG. 4, the first sealing member 3 is provided with, on the second main surface 3b, a sealing-member-side first bonding pattern 321, a pair of sealing-member-side excitation electrode bonding patterns 322, and four bonding patterns 323.

The sealing-member-side first bonding pattern 321 is bonded to the piezoelectric substrate 2 so as to seal a vibrating part 21 of the piezoelectric substrate 2. The sealing-member-side first bonding pattern 321 is disposed so as to surround the internal space SP.

Both of the pair of sealing-member-side excitation electrode bonding patterns 322 are formed inside the sealing-member-side first bonding pattern 321, and bonded respectively to excitation electrode bonding patterns 241 and 242 of the piezoelectric substrate 2, which are described later. The sealing-member-side excitation electrode bonding patterns 322 are conducted to the respective external electrodes 31 via the respective electrodes in the second through hole h32 and the fifth through hole h35.

The bonding patterns 323 are formed outside the sealing-member-side first bonding pattern 321, which are respectively formed at the four corners of the first sealing member 3. Also, the bonding patterns 323 are conducted to the respective external electrodes 31 via the respective electrodes in the first through fourth through holes h31 through h34 (see FIGS. 2 to 4).

The external electrodes 31, the sealing-member-side first bonding pattern 321, the sealing-member-side excitation electrode bonding patterns 322 and the bonding patterns 323 as described above are each constituted by a base PVD film deposited on the first main surface 3a or the second main surface 3b of the first sealing member 3 by physical vapor deposition, and an electrode PVD film deposited on the base PVD film by physical vapor deposition. In this embodiment, the base PVD film is made of Ti (or Cr), and the electrode PVD film is made of Au.

Piezoelectric Substrate

Figure 7:
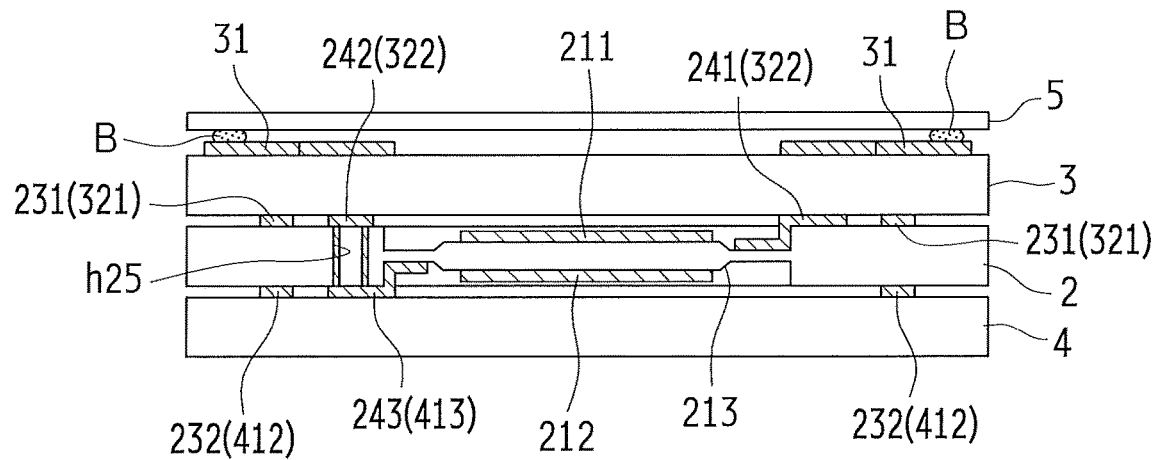
FIG. 7 is a cross-sectional view taken from line VII-VII in FIG. 5.

The piezoelectric substrate of the piezoelectric resonator device of the present invention is described with reference to FIGS. 5 to 7. FIG. 5 is a schematic plan view of the piezoelectric substrate of the piezoelectric resonator device. FIG. 6 is a schematic rear view of the piezoelectric substrate of the piezoelectric resonator device. FIG. 7 is a cross-sectional view taken from line VII-VII in FIG. 5.

As shown in FIGS. 5 and 6, the piezoelectric substrate 2 includes: the vibrating part 21; a holding part 22; and the external frame part 23 formed thicker than the vibrating part 21. In the example shown in the drawings, the piezoelectric substrate 2 also has cut-out parts formed by cutting out a rectangular-shaped crystal plate. The cut-out parts are constituted by an inversed U-shaped part k1 in plan view and an oblong rectangular part k2 in plan view. The piezoelectric substrate 2 is made of a crystal as a piezoelectric material, and both main surfaces thereof (i.e. the first main surface 2a and the second main surface 2b) are each formed as a smooth flat surface (mirror finished).

The vibrating part 21 has a substantially rectangular shape and is caused to piezoelectrically vibrate upon voltage application. The vibrating part 21 is not required to have square corner parts. The corner parts may be chamfered when the vibrating part 21 is formed by wet etching. A first excitation electrode 211 and a second excitation electrode 212 are respectively formed on the first main surface 2a and the second main surface 2b of the vibrating part 21 so as to apply a voltage to the vibrating part 21. At the position of the vibrating part 21 on which the first excitation electrode 211 and the second excitation electrode 212 are formed, a mesa structure 213 may be formed so that the central region of the vibrating part 21 is thicker than the region surrounding the central region. In this case, since the central part of the piezoelectric substrate 2 has a larger thickness as the mesa structure 213, it is possible to improve an effect of confining the piezoelectric vibration.

The first excitation electrode 211 and the second excitation electrode 212 are each constituted by a base PVD film (Ti or Cr) deposited on the vibrating part 21 by physical vapor deposition, and an electrode PVD film (Au) deposited on the base PVD film by physical vapor deposition.

The first excitation electrode 211 and the second excitation electrode 212 are extracted outside the vibrating part 21 respectively via a first extraction electrode 221 and a second extraction electrode 222 for extracting the excitation electrodes. In the example shown in the drawings, on the first main surface 2a, the first extraction electrode 221 is extracted from a corner part of the first excitation electrode 211 (see FIG. 5). On the second main surface 2b, the second extraction electrode 222 is extracted from a corner part of the second excitation electrode 212 so that its extracted direction is opposite to the direction in which the first extraction electrode 221 is extracted on the first main surface 2a (see FIG. 6).

The holding parts 22 and 22 are protruded respectively from two corner parts 21a disposed in the vibrating part 21 in the Z axis direction toward the external frame part 23 (see FIGS. 5 and 6). In the examples shown in the drawings, the first extraction electrode 221 extracted from the first excitation electrode 211 is disposed on the holding part 22 on the right side in plan view (in the +Z axis direction), and the second extraction electrode 222 extracted from the second excitation electrode 212 is disposed on the holding part 22 on the left side in bottom view (in the −Z axis direction) (see FIGS. 2, 5 and 6).

The external frame part 23 surrounds the outer periphery of the vibrating part 21 and holds the holding parts 22. A resonator-plate-side first bonding pattern 231, the pair of excitation electrode bonding patterns 241 and 242, and bonding patterns 251 are provided on the external frame part 23 of the first main surface 2a (see FIG. 5).

It is preferable that the thickness of the external frame part 23 is larger than the thickness of the holding parts 22 (see FIG. 7). In this case, because of the difference in the thickness between the external frame part 23 and the holding parts 22, the natural frequency of the piezoelectric vibration is also different between the external frame part 23 and the holding parts 22. Thus, the external frame part 23 hardly resonates with the piezoelectric vibration of the holding parts 22. Also, it is possible to enlarge each space between the piezoelectric substrate 2 and the first sealing member 3, and between the piezoelectric substrate 2 and the second sealing member 4. Thus, the vibrating part 21 of the piezoelectric resonator plate 2 can be prevented from making contact with the first sealing member 3 or the second sealing member 4.

The resonator-plate-side first bonding pattern 231 is bonded to the first sealing member 3, and is formed so as to surround the internal space SP.

The pair of excitation electrode bonding patterns 241 and 242 are formed inside the resonator-plate-side first bonding pattern 231 so as to be bonded, respectively, to the sealing-member-side excitation electrode bonding patterns 322 of the first sealing member 3. The excitation electrode bonding pattern 241 on the right side in plan view is to apply a voltage to the first excitation electrode 211, and is connected to the first extraction electrode 221. The excitation electrode bonding pattern 242 on the left side in plan view is to apply a voltage to the second excitation electrode 212, and has the eleventh through hole h25 to wire the second main surface 2b.

The bonding patterns 251 are formed outside the resonator-plate-side first bonding pattern 231, respectively on the four corners of the first main surface 2a. The bonding patterns 251 have, respectively, the seventh through tenth through holes h21 through h24 so as to wire respective bonding patterns 252 of the second main surface 2b.

A resonator-plate-side second bonding pattern 232, an excitation electrode bonding pattern 243 and the bonding patterns 252 are provided on the second main surface 2b of the external frame part 23 (see FIG. 6).

The resonator-plate-side second bonding pattern 232 is bonded to the second sealing member 4 (described later), and is formed so as to surround the internal space SP.

The excitation electrode bonding pattern 243 is disposed inside the resonator-plate-side second bonding pattern 232, and is connected to the excitation electrode bonding pattern 242 on the first main surface 2a via the eleventh through hole h25. Furthermore, the excitation electrode bonding pattern 243 is connected to the second extraction electrode 222.

The bonding patterns 252 are formed outside the resonator-plate-side second bonding pattern 232, respectively on the four corners of the second main surface 2b. The bonding patterns 252 are conducted to the respective bonding patterns 251 on the first main surface 2a through the seventh through tenth through holes h21 through h24.

The resonator-plate-side first bonding pattern 231, the resonator-plate-side second bonding pattern 232, the excitation electrode bonding patterns 241 to 243, and the bonding patterns 251 and 252 are each constituted by a base PVD film (Ti or Cr) deposited on the first main surface 2a or the second main surface 2b of the piezoelectric substrate 2 by physical vapor deposition, and an electrode PVD film (Au) deposited on the base PVD film by physical vapor deposition. These patterns contain no Sn. That is, the same materials as those used for the first excitation electrode 211 and the second excitation electrode 212 are used. However, the resonator-plate-side first bonding pattern 231, the resonator-plate-side second bonding pattern 232, the excitation electrode bonding patterns 241 to 243, and the bonding patterns 251 and 252 may be made of different electrode materials from those used for the first excitation electrode 211 and the second excitation electrode 212.

To the piezoelectric substrate 2 having the above-described configuration, the external electrodes 31 of the first sealing member 3 are connected by the excitation electrode bonding patterns 241 to 243 disposed on the external frame part 23 of the piezoelectric substrate 2. Thus, the external electrodes 31 are not superimposed to the first excitation electrode 211 and the second excitation electrode 212 formed on the vibrating part 21 in plan view.

Second Sealing Member

Figure 8:
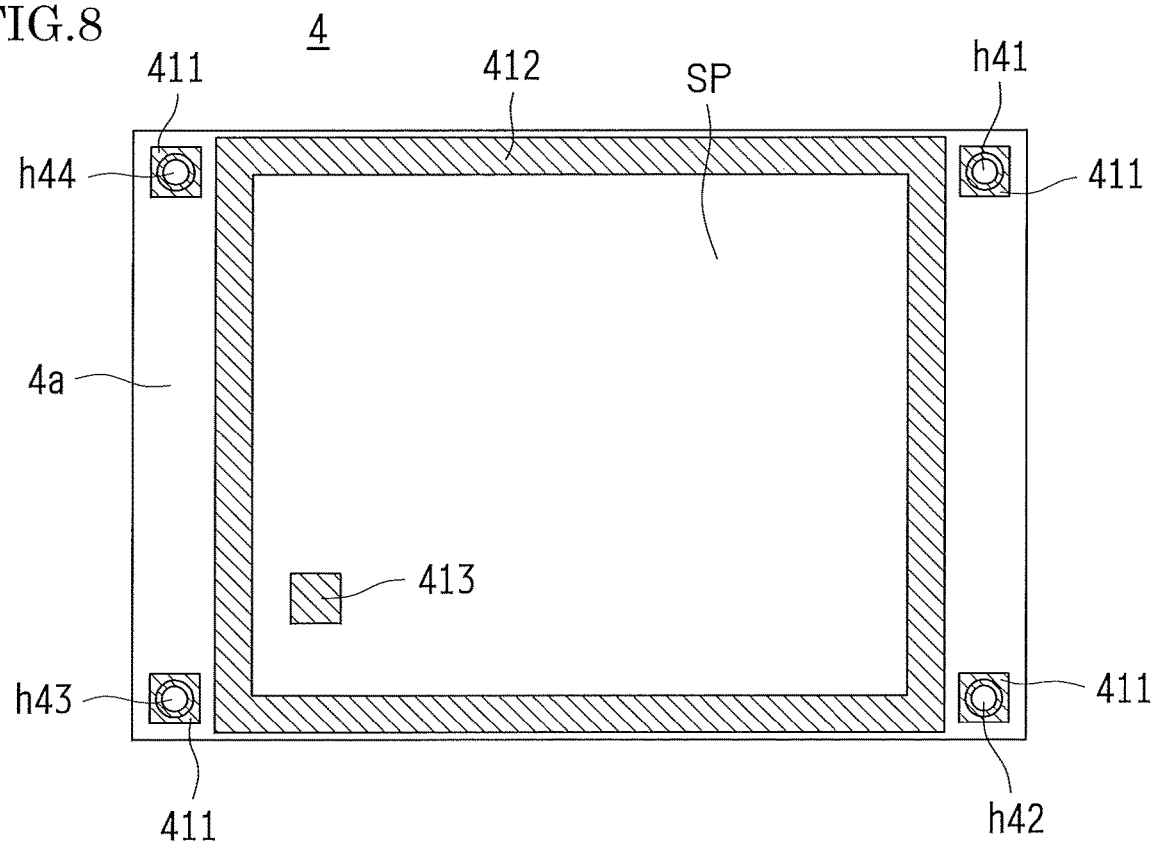
FIG. 8 is a schematic plan view illustrating a second sealing member of the piezoelectric resonator device according to the embodiment of the present invention.
Figure 9:
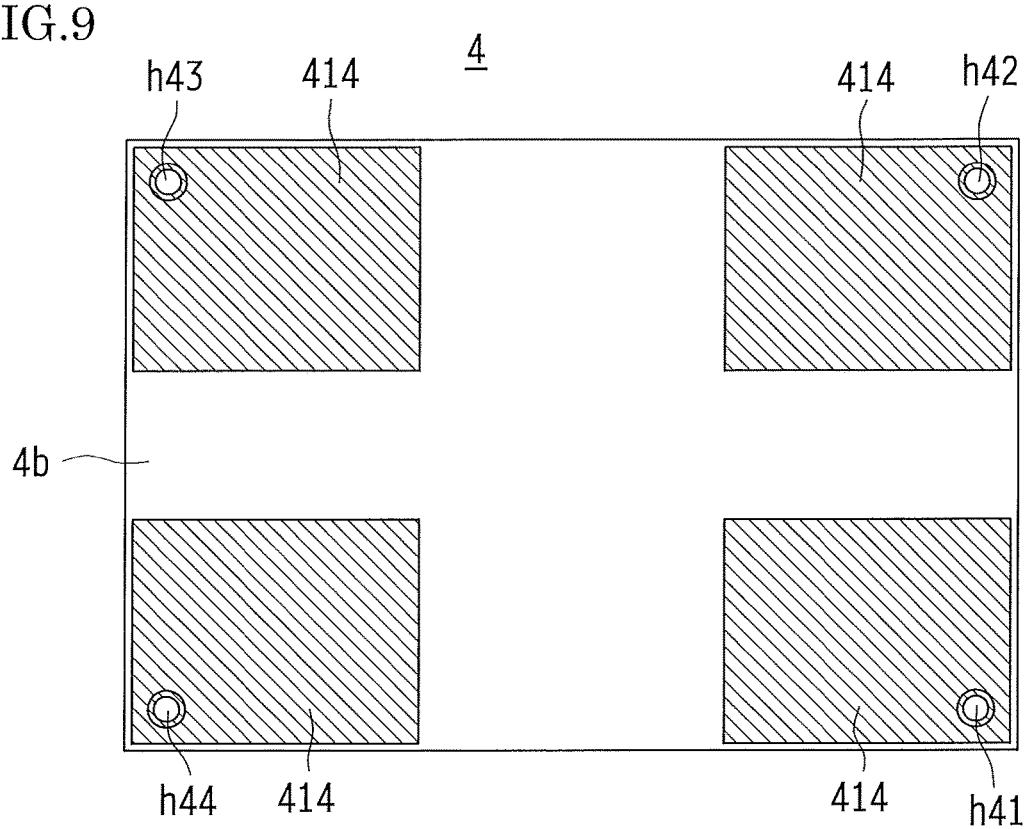
FIG. 9 is a schematic rear view illustrating the second sealing member of the piezoelectric resonator device according to the embodiment of the present invention.

The second sealing member 4 of the piezoelectric resonator device of the present invention is described with reference to FIGS. 8 and 9. FIG. 8 is a schematic plan view illustrating the second sealing member of the piezoelectric resonator device, and FIG. 9 is a schematic rear view illustrating the second sealing member of the piezoelectric resonator device.

The second sealing member 4 is made of a material having the flexural rigidity (moment of inertia of area× Young's modulus) of not more than 1000 [N·mm$^2$]. Specifically, as shown in FIG. 8, the second sealing member 4 is a substrate having a rectangular parallelepiped shape that is made of a single glass wafer or a single crystal wafer. A first main surface 4a (a surface to be bonded to the piezoelectric substrate 2) of the second sealing member 4 is formed as a smooth flat surface (mirror finished).

The second sealing member 4 is provided with, on the first main surface 4a, bonding patterns 411 respectively disposed on the four corners, a sealing-member-side second bonding pattern 412, and a sealing-member-side excitation electrode bonding pattern 413.

The bonding patterns 411 are electrically bonded respectively to the bonding patterns 252 formed on a second main surface 4b of the piezoelectric substrate 2. The bonding patterns 411 have, respectively, the twelfth through fifteenth through holes h41 through h44 so as to wire the respective external electrode terminals 414 of the second main surface 4b (see FIGS. 8 and 9).

The sealing-member-side second bonding pattern 412 is bonded to the second main surface 2b of the piezoelectric substrate 2 so as to seal the vibrating part 21 of the piezoelectric substrate 2. The sealing-member-side second bonding pattern 412 is disposed so as to surround the internal space SP (see FIG. 8).

The sealing-member-side excitation electrode bonding pattern 413 is bonded to the excitation electrode bonding pattern 243 of the second main surface 2b of the piezoelectric substrate 2.

The external electrode terminals 414 are respectively disposed on the four corners of the second main surface 4b of the second sealing member 4. The external electrode terminals 414 are electrically connected to the outside. The external electrode terminals 414 are respectively conducted to the bonding patterns 411 on the first main surface 4a of the second sealing member 4 by the bonding materials respectively provided in the twelfth through fifteenth through holes h41 through h44. Here, each external electrode terminal 414 has the minimum area that is superimposed to the first excitation electrode 211 and the second excitation electrode 212 in plan view. Thus, it is possible to reduce the parasitic capacity between the external electrode terminals 414 and the first excitation electrode 211, and between the external electrode terminals 414 and the second excitation electrode 212.

The bonding patterns 411, the sealing-member-side second bonding pattern 412, the sealing-member-side excitation electrode bonding pattern 413 and the external electrode terminals 414 are each constituted by a base PVD film deposited on the first main surface 4a or the second main surface 4b of the second sealing member 4 by physical vapor deposition, and an electrode PVD film deposited on the base PVD film by physical vapor deposition.

In this embodiment, the base PVD film is made of Ti (or Cr), and the electrode PVD film is made of Au.

External Element

The external element 5 of the present invention is, for example, an IC for a crystal oscillator, and is connected to the external electrodes 31 of the first sealing member 3 (see FIG. 2). The electrodes (not shown) on the external element 5, which are to be connected to the external electrodes 31 of the first sealing member 3, are formed at respective positions at least corresponding to the external frame part 23 of the piezoelectric substrate 2 in plan view.

Method for Manufacturing Piezoelectric Resonator Device

Next, a description will be given on a method for manufacturing the piezoelectric resonator device 1 using the piezoelectric substrate 2, the first sealing member 3, the second sealing member 4 and the external element 5.

When bonding the first sealing member 3 to the piezoelectric substrate 2, the resonator-plate-side first bonding pattern 231 of the piezoelectric substrate 2 is overlapped with the sealing-member-side first bonding pattern 321 of the first sealing member 3, the excitation electrode bonding patterns 241 and 242 of the piezoelectric substrate 2 are respectively overlapped with the sealing-member-side excitation electrode bonding patterns 322 of the first sealing member 3, and the bonding patterns 251 of the piezoelectric substrate 2 are respectively overlapped with the bonding patterns 323 of the first sealing member 3. In this way, the respective metals are subjected to diffusion bonding.

When bonding the second sealing member 4 to the piezoelectric substrate 2, the resonator-plate-side second bonding pattern 232 of the piezoelectric substrate 2 is overlapped with the sealing-member-side second bonding pattern 412 of the second sealing member 4, the excitation electrode bonding pattern 243 of the piezoelectric substrate 2 is overlapped with the sealing-member-side excitation electrode bonding pattern 413 of the second sealing member 4, and the bonding patterns 252 of the piezoelectric substrate 2 are respectively overlapped with the bonding patterns 411 of the second sealing member 4. In this way, the respective metals are subjected to diffusion bonding.

Here, the first through hole h31 of the first sealing member 3 is conducted to the seventh through hole h21 of the piezoelectric substrate 2 and to the twelfth through hole h41 of the second sealing member 4 via the bonding pattern 323, the bonding pattern 251, and the electrodes (not shown) in the respective through holes h31, h21 and h41. The third through hole h33 of the first sealing member 3 is conducted to the eighth through hole h22 of the piezoelectric substrate 2 and to the thirteenth through hole h42 of the second sealing member 4 via the bonding pattern 323, the bonding pattern 251, and the electrodes (not shown) in the respective through holes h33, h22 and h42. The fourth through hole h34 of the first sealing member 3 is conducted to the ninth through hole h23 of the piezoelectric substrate 2 and to the fourteenth through hole h43 of the second sealing member 4 via the bonding pattern 323, the bonding pattern 251, and the electrodes (not shown) in the respective through holes h34, h23 and h43. The sixth through hole h36 of the first sealing member 3 is conducted to the tenth through hole h24 of the piezoelectric substrate 2 and to the fifteenth through hole h44 of the second sealing member 4 via the bonding pattern 323, the bonding pattern 251, and the electrodes (not shown) in the respective through holes h36, h24 and h44.

Furthermore, the second through hole h32 of the first sealing member 3 is conducted to the excitation electrode bonding pattern 241 of the piezoelectric substrate 2 via the electrodes (not shown) in the second through hole h32. The fifth through hole h35 is conducted, via the electrodes (not shown) in the through holes h35 and h25, to the eleventh through hole h25 of the piezoelectric substrate 2 and also to the excitation electrode bonding pattern 243 to which the second extraction electrode 222 of the piezoelectric substrate 2 is connected.

Using the diffusion bonding as the above bonding method can prevent generation of gas that occurs in case of bonding using an adhesive and the like, however, it is possible to use a publicly known special bonding material such as an adhesive.

The external electrodes 31 of the first sealing member 3 and the external element 5 are connected to each other outside the internal space SP by flip chip bonding.

In the piezoelectric resonator device 1 manufactured as described above, the first sealing member 3 and the piezoelectric substrate 2 have a gap of not more than 1.00 µm. The second sealing member 4 and the piezoelectric substrate 2 have a gap of not more than 1.00 µm. That is, the thickness of the bonding material between the first sealing member 3 and the piezoelectric substrate 2 is not more than 1.00 µm, and the thickness of the bonding material between the second sealing member 4 and the piezoelectric substrate 2 is not more than 1.00 µm (specifically, the thickness in the Au—Au bonding of this embodiment is 0.15 to 1.00 µm). As a comparative example, the conventional metal paste sealing material containing Sn has a thickness of 5 to 20 µm.

Functions and Effects of Piezoelectric Resonator Device

In the configuration of the piezoelectric resonator device of the present invention, the external electrodes 31 to be connected to the external element 5 are disposed on at least one of the first sealing member 3 and the second sealing member 4. The external element 5 is connected to the external electrodes 31 at the position corresponding to at least the external frame part 23 of the piezoelectric substrate 2 in plan view. Thus, even when the external element 5 is pressed, the inside of the sealed region (internal space SP) in which the vibrating part 21 is sealed can be prevented from being pressed.

Each external electrode 31 of the first sealing member 3 and/or second sealing member 4 has a small area that is superimposed to the first excitation electrode 211 and the second excitation electrode 212 in plan view. Thus, it is possible to reduce the parasitic capacity between the external electrodes 31 and the first excitation electrode 211, and between the external electrodes 31 and the second excitation electrode 212.

The metal bumps (bonding materials B) to be connected to the external element 5 are disposed on the external frame part 23 of the piezoelectric substrate 2. Thus, even when the external element 5 is pressed at the time of flip chip bonding, it is possible to prevent the inside of the sealed region (internal space SP) from bending. Also, since the inside of the sealed region is not likely to bend when the external element 5 is connected using the metal bumps (bonding materials B), the external element 5 can be stably bonded. Note that it is also possible to use a bonding material other than the metal bump.

Also, since the external electrodes (the external electrodes for the first excitation electrode and the external electrode for the second excitation electrode) 31 and 31, which are to be connected respectively to the first excitation electrode 211 and the second excitation electrode 212, are disposed on the first main surface 3a (i.e., the external main surface not facing the piezoelectric substrate 2) of the first sealing member 3, it is possible to easily test the piezoelectric substrate 2 before bonding it to the second sealing member 4, using the external electrodes 31 and 31 as test terminals for the piezoelectric substrate 2.

In this case, it is preferable to provide the above test terminals on the outer parts 31a and 31b, which are disposed at the position corresponding to the external frame part 23 of the piezoelectric substrate 2 in plan view, of the external electrodes (the external electrode for the first excitation electrode and the external electrode for the second excitation electrode) 31 and 31. Since an inspection probe makes contact with the test terminal, the pressure when the probe makes contact with the test terminal is applied to the first sealing member 3. Thus, if the test terminals are provided inside the external frame part 23 of the piezoelectric substrate 2 in plan view, the pressure when the probe makes contact with the test terminal may deform (bend) the first sealing member 3. Such deformation of the first sealing member 3 may decrease the distance between the first sealing member 3 and the vibrating part 21 (the first excitation electrode 211) of the piezoelectric substrate 2 or may cause the first sealing member 3 and the vibrating part 21 (the first excitation electrode 211) of the piezoelectric substrate 2 to make contact with each other. For this reason, the piezoelectric vibration of the vibrating part 21 of the piezoelectric substrate 2 may be prevented or the stray capacity may change. However, by forming the test terminals on the outer parts 31a and 31b of the external electrodes 31 and 31, the outer parts 31a and 31b when contacted by the probe can be supported by the external frame part 23 of the piezoelectric substrate 2 that is disposed under the outer parts 31a and 31b. Thus, it is possible to distribute, from the first sealing member 3 to the piezoelectric substrate 2, the pressure when the probe makes contact with the test terminal, which leads to prevention of deformation of the first sealing member 3. In this way, it is possible to prevent the block of the piezoelectric vibration of the vibrating part 21 of the piezoelectric substrate 2 or to suppress the change in the stray capacity, both of which are caused by deformation of the first sealing member 3.

Also, only the bonding material B that connects the external electrode for the first excitation electrode to the external element 5 is disposed at the position superimposed to the wiring (first wiring) connecting the first excitation electrode 211 to the external electrode for the first excitation electrode in plan view. Only the bonding material B that connects the external electrode for the second excitation electrode to the external element 5 is disposed at the position superimposed to the wiring (second wiring) connecting the second excitation electrode 212 to the external electrode for the second excitation electrode in plan view. The wiring (first wiring) connecting the first excitation electrode 211 to the external electrode for the first excitation electrode includes the first extraction electrode 221, the excitation electrode bonding pattern 241 and the second through hole h32. The wiring (second wiring) connecting the second excitation electrode 212 to the external electrode for the second excitation electrode includes the second extraction electrode 222, the eleventh through hole h25, the excitation electrode bonding pattern 242 and the fifth through hole h35. That is, the bonding materials B and B that are respectively connected to the excitation electrodes (the first excitation electrode 211 and the second excitation electrode 212) are not superimposed, in plan view, to the wirings (the second wiring and the first wiring) respectively connected to the excitation electrodes with different polarity from those connected to the bonding materials B and B (i.e. the second excitation electrode 212 and the first excitation electrode 211). In addition to the above, the bonding materials B that are not connected to the excitation electrodes (the first excitation electrode 211 and the second excitation electrode 212) are not superimposed, in plan view, to the wirings (the first wiring and the second wiring) that are connected to the excitation electrodes. In this way, it is possible to reduce the parasitic capacity caused by superposition of the bonding material B and the wiring respectively connected to the excitation electrodes with different polarity, and to reduce the parasitic capacity caused by superposition of the bonding materials B that are not connected to the excitation electrodes and the wirings that are connected to the excitation electrodes.

Among the external electrodes 31, the external electrodes (other external electrodes) that are not connected to the first excitation electrode 211 and the second excitation electrode 212, i.e. the external electrodes 31 other than the external electrodes for the first excitation electrode and for the second excitation electrode, are each disposed at the position not superimposed to the first wiring and the second wiring in plan view. In this way, it is possible to reduce the parasitic capacity caused by superposition of the other external electrodes and the wirings (the first wiring and the second wiring) connected to the excitation electrodes (the first excitation electrode 211 and the second excitation electrode 212). Furthermore, the external electrode for the first excitation electrode is disposed at the position not superimposed to the second wiring in plan view while the external electrode for the second excitation electrode is disposed at the position not superimposed to the first wiring in plan view. In this way, it is possible to reduce the parasitic capacity caused by superposition of the external electrodes (the external electrode for the first excitation electrode and the external electrode for the second excitation electrode) connected to the excitation electrodes (the first excitation electrode and the second excitation electrode) and the wirings (the second wiring and the first wiring) respectively connected to the excitation electrodes with different polarity from those connected to the external electrodes (i.e. the second excitation electrode and the first excitation electrode).

Variation of Piezoelectric Resonator Device

The above-described embodiment or aspect of the present invention is specifically shown as an example of the present invention, which does not limit the technical scope of the present invention.

For example, in the described configuration, the external element 5 is bonded to the first sealing member 3. However, it may be the second sealing member 4 to which the external element 5 is bonded.

Also, in the described configuration, one external element 5 is mounted. However, the present invention is not limited thereto. A plurality of external elements (for example, ICs) may be mounted on the first main surface 3a of the first sealing member 3. For example, when two ICs are mounted on the first main surface 3a of the first sealing member 3, one IC may be used as the IC for the crystal oscillator, and the other IC may be adopted to use for variable purposes. That is, the other IC may be a phase locked loop (PLL) IC, a heater driver IC when the crystal oscillator includes a heater for adjusting the temperature, an output buffer IC for changing the format of the output signal, or the real time clock (RTC) IC.

Also, in the described configuration, the respective external electrode terminals 414 are formed on the four corners of the second sealing member 4, which means the number of the external electrode terminals 414 is four. However, the present invention is not limited thereto. Four or more external electrode terminals 414 may be formed.

Also, in the described configuration, the external element 5 is connected to the external electrodes 31 at the position corresponding to only the external frame part 23 of the piezoelectric substrate 2 in plan view. However, the present invention is not limited thereto. The external element 5 may be connected to the external electrodes 31 at the position partially corresponding to the external frame part 23 of the piezoelectric substrate 2 in plan view. That is, it is sufficient that the external element 5 is connected to the external electrodes 31 at the position at least partially corresponding to the external frame part 23 of the piezoelectric substrate 2 in plan view.

Figure 10:
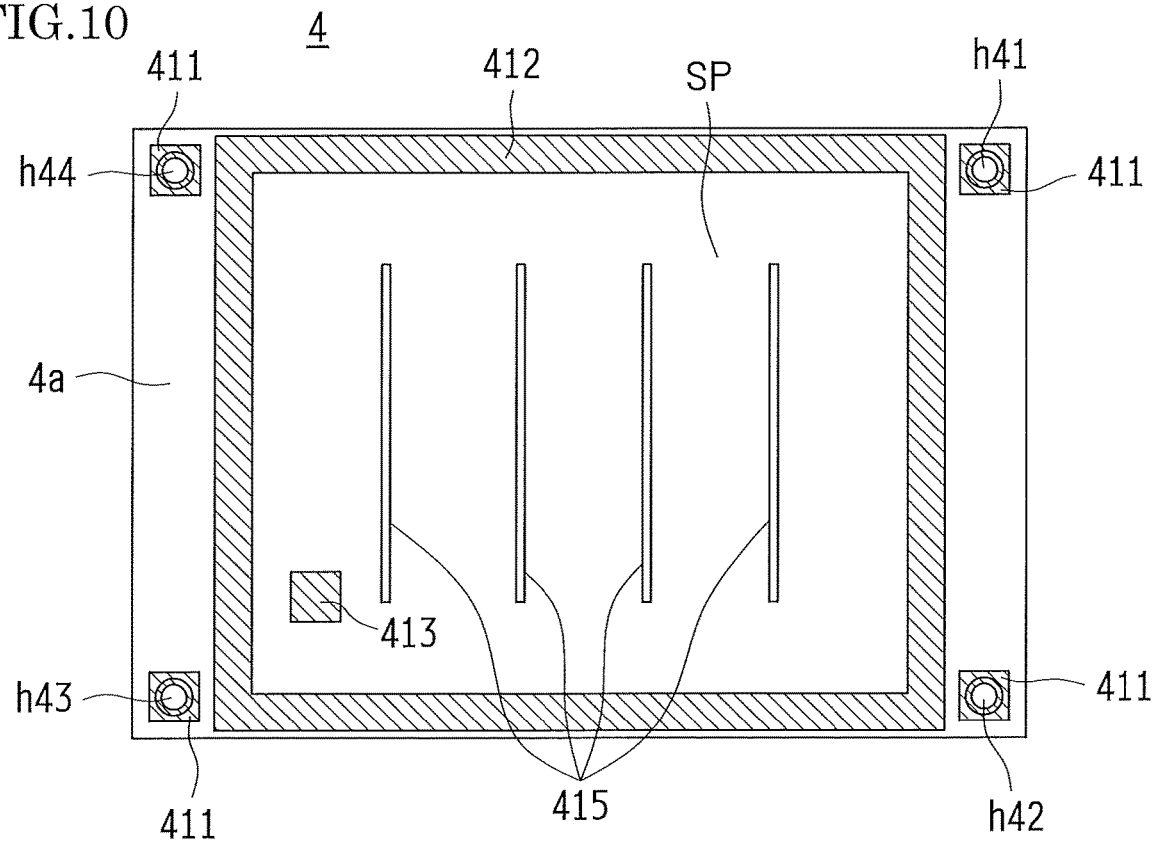
FIG. 10 is a schematic plan view illustrating a variation of the second sealing member of the piezoelectric resonator device.

Also, the above-described piezoelectric resonator device may include grooves 415 in the first main surface 4a of the second sealing member 4, as shown in FIG. 10. In the example shown in FIG. 10, four grooves 415 linearly extending are formed in the first main surface 4a of the second sealing member 4. The four grooves 415 are arranged in parallel to one another at predetermined intervals. The four grooves 415 extend in parallel to the short-side direction of the second sealing member 4. The four grooves 415 are formed in the surface of the second sealing member 4 so as to face the internal space SP. The grooves 415 are formed in the first main surface 4a of the second sealing member 4, preferably by wet etching or dry etching. Also, it is possible to form the grooves 415 in the first main surface 4a of the second sealing member 4 by a method such as laser processing.

These grooves 415 serve as an adjusting part for adjusting the natural frequency of the package of the piezoelectric resonator device. That is, by adjusting the number, shape, size and the like of the grooves 415, the natural frequency of the package can easily be adjusted. Thus, by adjusting the natural frequency of the package by the grooves 415, it is possible to easily differentiate the natural frequency of the package from the frequency of vibration that leaks from the vibrating part 21 of the piezoelectric substrate 2 to the package. As a result, it is possible to suppress the resonance of the package caused by the vibration that leaks from the vibrating part 21 of the piezoelectric substrate 2 to the package.

Here, the first sealing member 3, the piezoelectric substrate 2 and the second sealing member 4 are laminated and bonded without using any conductive adhesive. Thus, the vibration of the vibrating part 21 of the piezoelectric substrate 2 is likely to leak to the package compared to the case in which the conductive adhesive is used. For this reason, the package may resonate with the vibrating part 21 because of the leakage of vibration from the vibrating part 21 of the piezoelectric substrate 2 to the package. However, by adjusting the natural frequency of the package by the grooves 415, it is possible to differentiate the natural frequency of the package from the frequency of vibration that leaks from the vibrating part 21 of the piezoelectric substrate 2 to the package. Consequently, it is possible to suppress the resonance of the package caused by the vibration that leaks from the vibrating part 21 of the piezoelectric substrate 2 to the outside.

Also, since the grooves 415 are formed in the first main surface 4a of the second sealing member 4 so as to face the internal space SP, the grooves 415 are protected by the package. Thus, the changes in the shape, size and the like of the grooves 415 caused by the contact of the package with the outside can be prevented, accordingly, it is possible to prevent the natural frequency of the package from being changed according to the changes in the shape, size and the like of the grooves 415 after the package is hermetically sealed. Thus, there is no need to adjust the natural frequency of the package. Furthermore, it is possible to improve the degree of freedom in the wiring on the second main surface 4b of the second sealing member 4 to connect to the external elements. Thus, the area necessary to the wiring can easily be saved.

It is possible to suitably change the number, shape, size and the like of the grooves 415. Also, the grooves can be disposed in the second main surface 3b of the first sealing member 3 so as to face the internal space SP, in place of the first main surface 4a of the second sealing member 4. Alternatively, the grooves can be disposed in both the second main surface 3b of the first sealing member 3 and the first main surface 4a of the second sealing member 4 so as to face the internal space SP. Regarding the adjusting part for adjusting the natural frequency of the package, it is possible to adopt the adjusting part other than the grooves, e.g. bottomed holes. Also, as such an adjusting part, it is also possible to use a protrusion or a step (step part) formed on at least one of the first sealing member 3 and the second sealing member 4, or a weight fixed on at least one of the first sealing member 3 and the second sealing member 4. The natural frequency of the package can also be adjusted using a load mass such as a vapor deposited film formed on at least one of the first sealing member 3 and the second sealing member 4. Further, the natural frequency of the package can be adjusted by changing the thickness of the at least one of the first sealing member 3 and the second sealing member 4.

Also, in the above-described piezoelectric resonator device, bonding patterns for support may be formed inside the annular-shaped bonding patterns for sealing (i.e. the resonator-plate-side first bonding pattern 231 of the piezoelectric substrate 2 and the sealing-member-side first bonding pattern 321 of the first sealing member 3, and the resonator-plate-side second bonding pattern 232 of the piezoelectric substrate 2 and the sealing-member-side second bonding pattern 412 of the second sealing member 4). For example, as shown in FIGS. 11 to 14, the bonding patterns for support may be formed on the piezoelectric substrate 2, and the first and second sealing members 3 and 4. FIG. 11 is a schematic rear view illustrating a variation of the first sealing member 3 of the piezoelectric resonator device, which corresponds to FIG. 4. FIG. 12 is a schematic plan view illustrating the variation of the piezoelectric substrate 2 of the piezoelectric resonator device, which corresponds to FIG. 5. FIG. 13 is a schematic rear view illustrating the variation of the piezoelectric substrate 2 of the piezoelectric resonator device, which corresponds to FIG. 6. FIG. 14 is a schematic plan view illustrating the variation of the second sealing member 4 of the piezoelectric resonator device, which corresponds to FIG. 8.

As shown in FIG. 12, the excitation electrode bonding pattern 241, which is connected to the first extraction electrode 221 extracted from the first excitation electrode 211, extends in the X axis direction in FIG. 12 on the external frame part 23 of the first main surface 2a of the piezoelectric substrate 2. Also, the excitation electrode bonding pattern 242 of the eleventh through hole h25, which is formed on the external frame part 23 of the first main surface 2a of the piezoelectric substrate 2, extends in the X axis direction in FIG. 12. The excitation electrode bonding patterns 241 and 242 are the bonding patterns for support as described above. The excitation electrode bonding patterns 241 and 242 are formed between the resonator-plate-side first bonding pattern 231 and the cut-out parts. The excitation electrode bonding patterns 241 and 242 are disposed respectively on both sides in the Z axis direction in FIG. 12, with the vibrating part 21 being interposed therebetween. The excitation electrode bonding patterns 241 and 242 extend in the short-side direction of the piezoelectric substrate 2. Also, the excitation electrode bonding patterns 241 and 242 are disposed respectively spaced apart, by a predetermined distance, from the resonator-plate-side first bonding pattern 231 whose outer edge and inner edge each have a substantially rectangular shape, while the excitation electrode bonding patterns 241 and 242 are disposed along the short side of the resonator-plate-side first bonding pattern 231. The excitation electrode bonding patterns 241 and 242 are set to have a length (a length in the X axis direction in FIG. 12) not less than 50% of the length of the short side of the resonator-plate-side first bonding pattern 231.

As shown in FIG. 13, the excitation electrode bonding pattern 243 of the eleventh through hole h25, which is formed on the second main surface 2b of the piezoelectric substrate 2, extends in the X axis direction in FIG. 13 on the external frame part 23. The excitation electrode bonding pattern 243 is integrally formed with the second extraction electrode 222 extracted from the second excitation electrode 212. Also, a bonding pattern 244, which is formed on the second main surface 2b of the piezoelectric substrate 2, extends in the X axis direction in FIG. 13 on the external frame part 23. The excitation electrode bonding pattern 243 and the bonding pattern 244 are the bonding patterns for support as described above. The excitation electrode bonding pattern 243 and the bonding pattern 244 are formed between the resonator-plate-side second bonding pattern 232 and the cut-out parts. The excitation electrode bonding pattern 243 and the bonding pattern 244 are disposed respectively on both sides in the Z axis direction in FIG. 13, with the vibrating part 21 being interposed therebetween. The excitation electrode bonding pattern 243 and the bonding pattern 244 extend in the short-side direction of the piezoelectric substrate 2. Also, the excitation electrode bonding pattern 243 and the bonding pattern 244 are disposed respectively spaced apart, by a predetermined distance, from the resonator-plate-side second bonding pattern 232 whose outer edge and inner edge each have a substantially rectangular shape, while the excitation electrode bonding pattern 243 and the bonding pattern 244 are disposed along the short side of the resonator-plate-side second bonding pattern 232. The excitation electrode bonding pattern 243 and the bonding pattern 244 are set to have a length (a length in the X axis direction in FIG. 13) not less than 50% of the length of the short side of the resonator-plate-side second bonding pattern 232.

As shown in FIG. 11, the bonding patterns 322 and 322 of the second through hole h32 and the fifth through hole h35, which are formed on the second main surface 3b of the first sealing member 3, extend in the A1 direction in FIG. 11. The bonding patterns 322 and 322 are the bonding patterns for support as described above. The bonding patterns 322 and 322 extend in the short-side direction of the first sealing member 3. The bonding patterns 322 and 322 are disposed respectively spaced apart, by a predetermined distance, from the sealing-member-side first bonding pattern 321 whose outer edge and inner edge each have a substantially rectangular shape, while the bonding patterns 322 and 322 are disposed along the short side of the sealing-member-side first bonding pattern 321. The bonding patterns 322 and 322 are set to have a length (a length in the A1 direction in FIG. 11) not less than 50% of the length of the short side of the sealing-member-side first bonding pattern 321. The bonding patterns 322 and 322 are disposed respectively at the positions substantially overlapping with the excitation electrode bonding patterns 241 and 242 on the first main surface 2a of the piezoelectric substrate 2 in plan view. The distance between the bonding patterns 322 and 322 in the A2 direction in FIG. 11 is substantially the same as the distance between the excitation electrode bonding patterns 241 and 242 in the Z axis direction (see FIG. 12) on the first main surface 2a of the piezoelectric substrate 2.

As shown in FIG. 14, the sealing-member-side excitation electrode bonding pattern 413 extends in the B1 direction in FIG. 14 on the first main surface 4a of the second sealing member 4. Also, a bonding pattern 416 is formed on the first main surface 4a of the second sealing member 4 so as to be spaced apart, by a predetermined distance, from the sealing-member-side excitation electrode bonding pattern 413 in the B2 direction in FIG. 14. The bonding pattern 416 extends in the B1 direction in FIG. 14. The sealing-member-side excitation electrode bonding pattern 413 and the bonding pattern 416 are the bonding patterns for support as described above. The sealing-member-side excitation electrode bonding pattern 413 and the bonding pattern 416 extend in the short-side direction of the second sealing member 4. Also, the sealing-member-side excitation electrode bonding pattern 413 and the bonding pattern 416 are disposed respectively spaced apart, by a predetermined distance, from the sealing-member-side second bonding pattern 412 whose outer edge and inner edge each have a substantially rectangular shape, while the sealing-member-side excitation electrode bonding pattern 413 and the bonding pattern 416 are disposed along the short side of the sealing-member-side second bonding pattern 412. The sealing-member-side excitation electrode bonding pattern 413 and the bonding pattern 416 are set to have a length (a length in the B1 direction in FIG. 14) not less than 50% of the length of the short side of the sealing-member-side second bonding pattern 412. The sealing-member-side excitation electrode bonding pattern 413 and the bonding pattern 416 are disposed respectively at the positions substantially overlapping with the excitation electrode bonding pattern 243 and the bonding pattern 244 on the second main surface 2b of the piezoelectric substrate 2 in plan view. The distance between the sealing-member-side excitation electrode bonding pattern 413 and the bonding pattern 416 in the B2 direction in FIG. 14 is substantially the same as the distance between the excitation electrode bonding pattern 243 and the bonding pattern 244 on the second main surface 2b of the piezoelectric substrate 2 in the Z axis direction (see FIG. 13).

As described above, when the piezoelectric substrate 2 and the first and second sealing members 3 and 4 are layered, each bonding pattern for support (i.e. the excitation electrode bonding patterns 241 and 242 on the first main surface 2a of the piezoelectric substrate 2, the excitation electrode bonding pattern 243 and the bonding pattern 244 on the second main surface 2b of the piezoelectric substrate 2, the bonding patterns 322 and 322 of the first sealing member 3, and the sealing-member-side excitation electrode bonding pattern 413 and the bonding pattern 416 of the second sealing member 4) is bonded to the corresponding bonding pattern for support in a state in which they are overlapped with each other. Specifically, the excitation electrode bonding patterns 241 and 242 on the first main surface 2a of the piezoelectric substrate 2 are respectively bonded to the bonding patterns 322 and 322 of the first sealing member 3. The excitation electrode bonding pattern 243 and the bonding pattern 244 on the second main surface 2b of the piezoelectric substrate 2 are respectively bonded to the sealing-member-side excitation electrode bonding pattern 413 and the bonding pattern 416 of the second sealing member 4.

These bonding patterns for support are disposed inside the annular-shaped bonding patterns for sealing (i.e. the resonator-plate-side first bonding pattern 231 of the piezoelectric substrate 2 and the sealing-member-side first bonding pattern 321 of the first sealing member 3, and the resonator-plate-side second bonding pattern 232 of the piezoelectric substrate 2 and the sealing-member-side second bonding pattern 412 of the second sealing member 4) in plan view. In this case, by reducing the respective distances between the bonding patterns for sealing and the bonding patterns for support, it is possible to prevent the first sealing member 3 and the second sealing member 4 from deforming (bending) when a pressure is applied at the time of bonding. That is, since the first sealing member 3 is supported relative to the piezoelectric substrate 2 by the bonding patterns for sealing and the bonding patterns for support, it is possible to prevent deformation of the first sealing member 3. Also, since the second sealing member 4 is supported relative to the piezoelectric substrate 2 by the bonding patterns for sealing and the bonding patterns for support, it is possible to prevent deformation of the second sealing member 4. Therefore, it is possible to suppress the following problems derived from deformation of the first sealing member 3 and the second sealing member 4: decrease in the bonding strength of the bonding patterns for sealing in order to seal the vibrating part 21 of the piezoelectric substrate 2; and residual strain at the time of bonding. As a result, it is possible to prevent degradation in hermeticity of the internal space SP by the bonding patterns for sealing, and also to prevent characteristic variations of the vibrating part 21.

Figure 15:
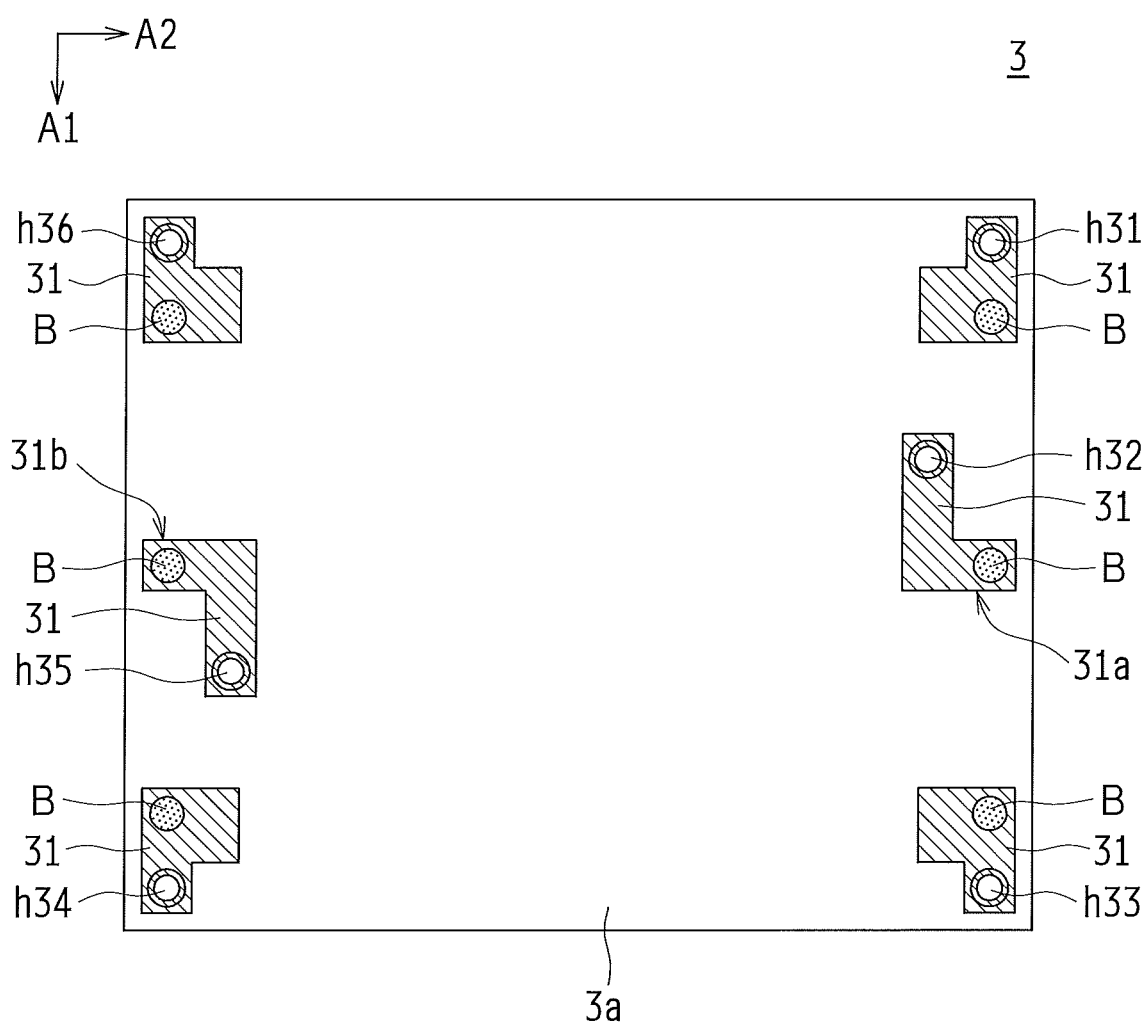
FIG. 15 is a schematic plan view illustrating a variation of the first sealing member of the piezoelectric resonator device.
Figure 16:
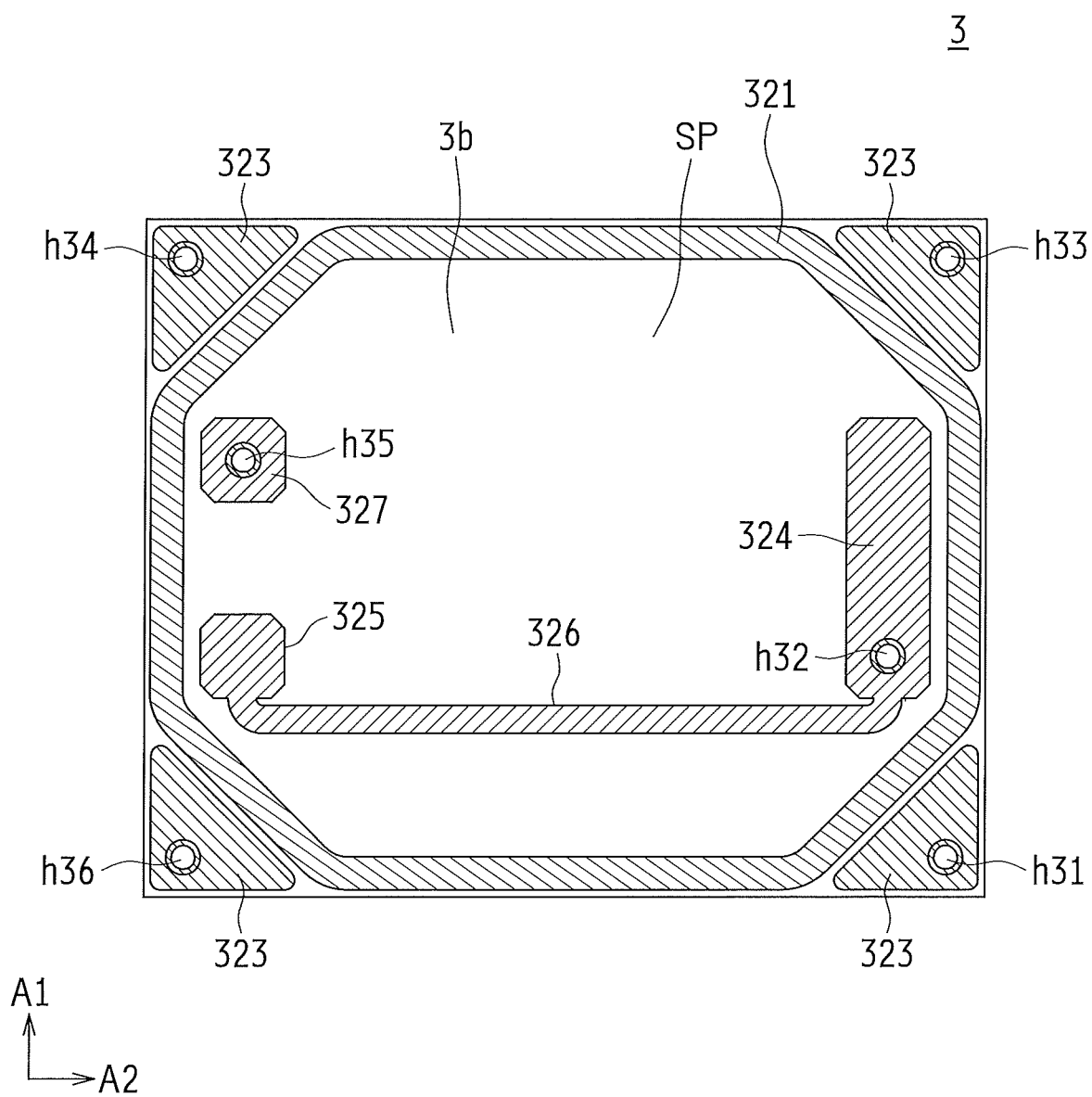
FIG. 16 is a schematic rear view illustrating the variation of the first sealing member of the piezoelectric resonator device.
Figure 17:
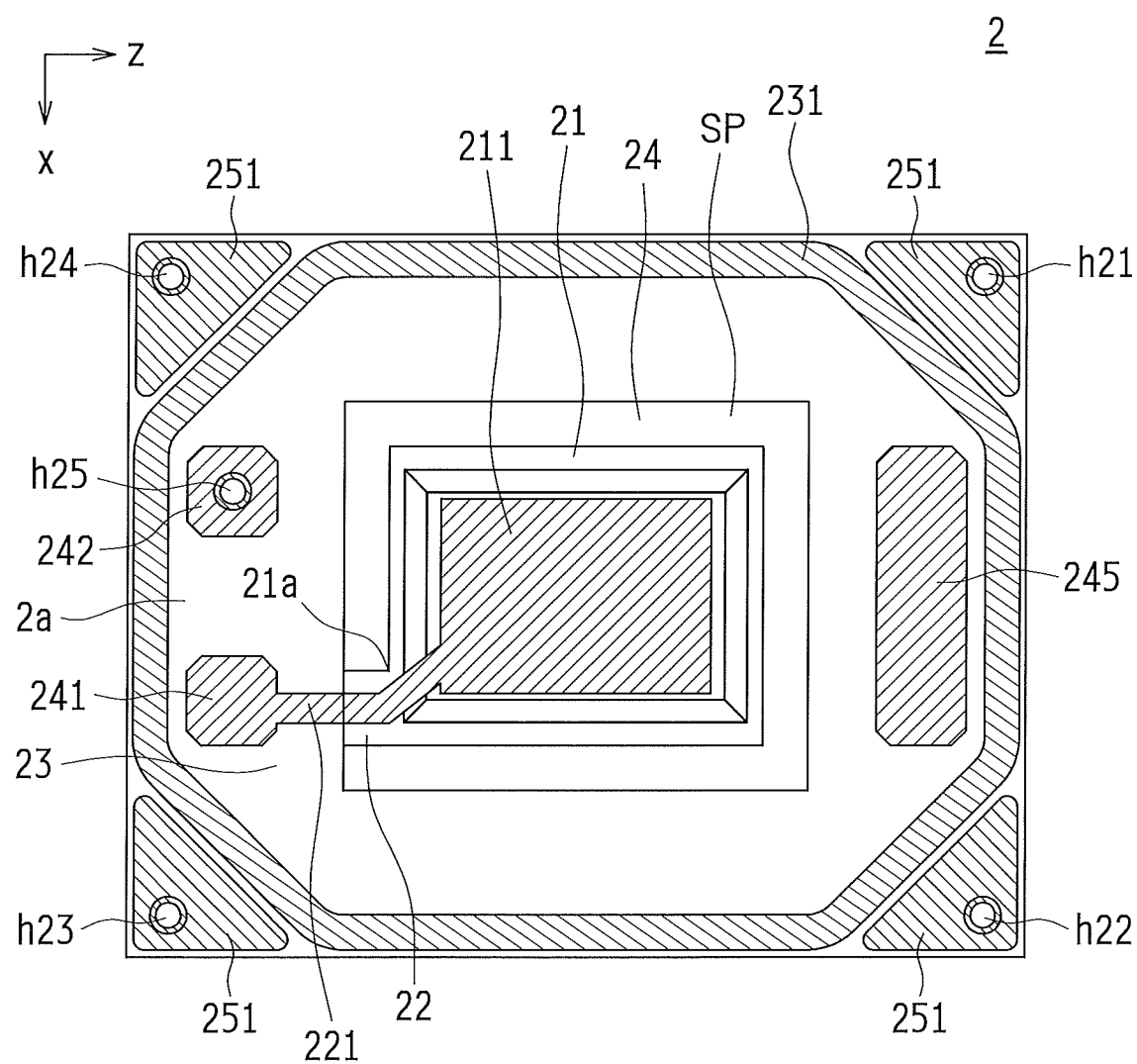
FIG. 17 is a schematic plan view illustrating the variation of the piezoelectric substrate of the piezoelectric resonator device.
Figure 18:
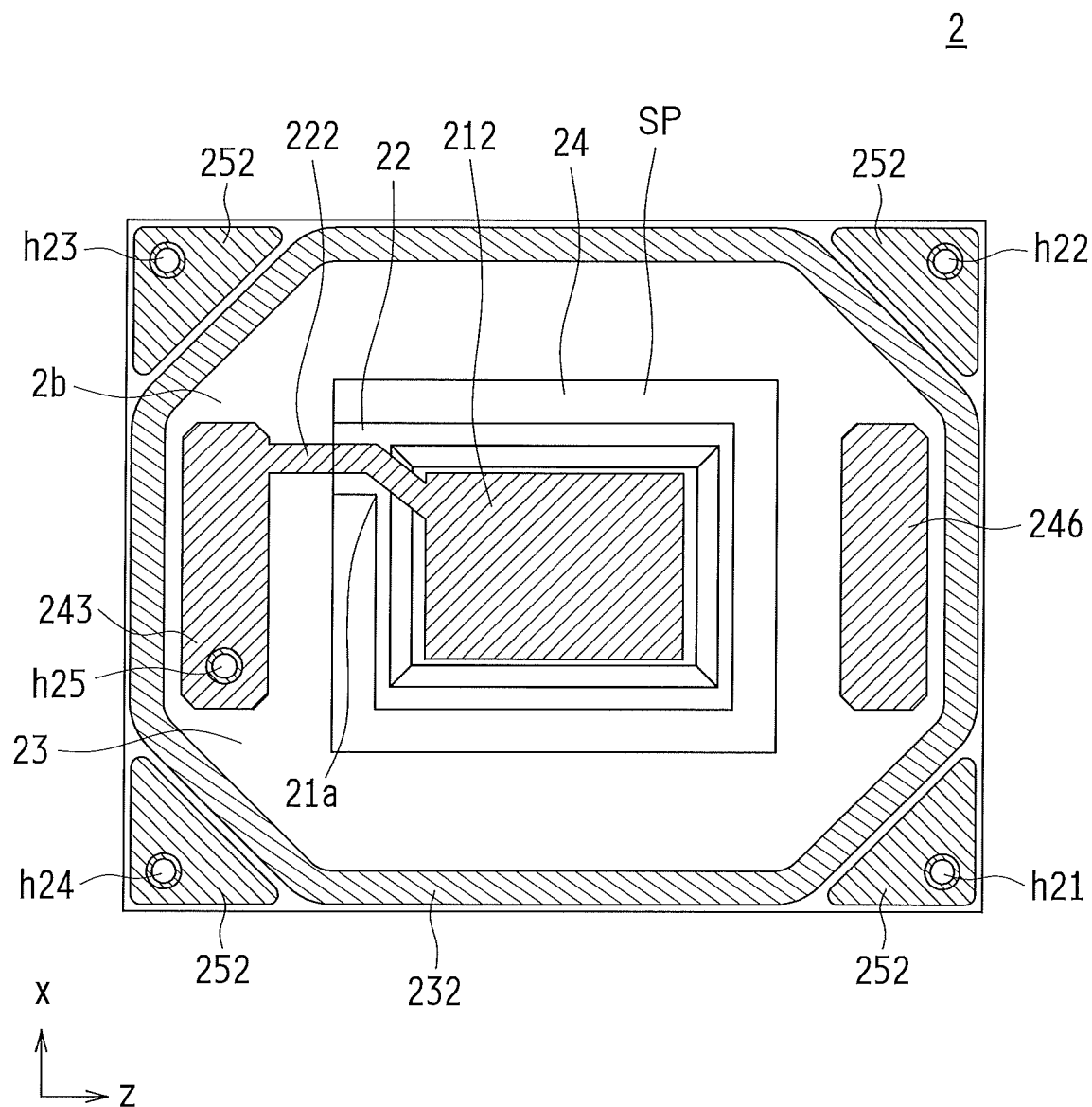
FIG. 18 is a schematic rear view illustrating the variation of the piezoelectric substrate of the piezoelectric resonator device.
Figure 19:
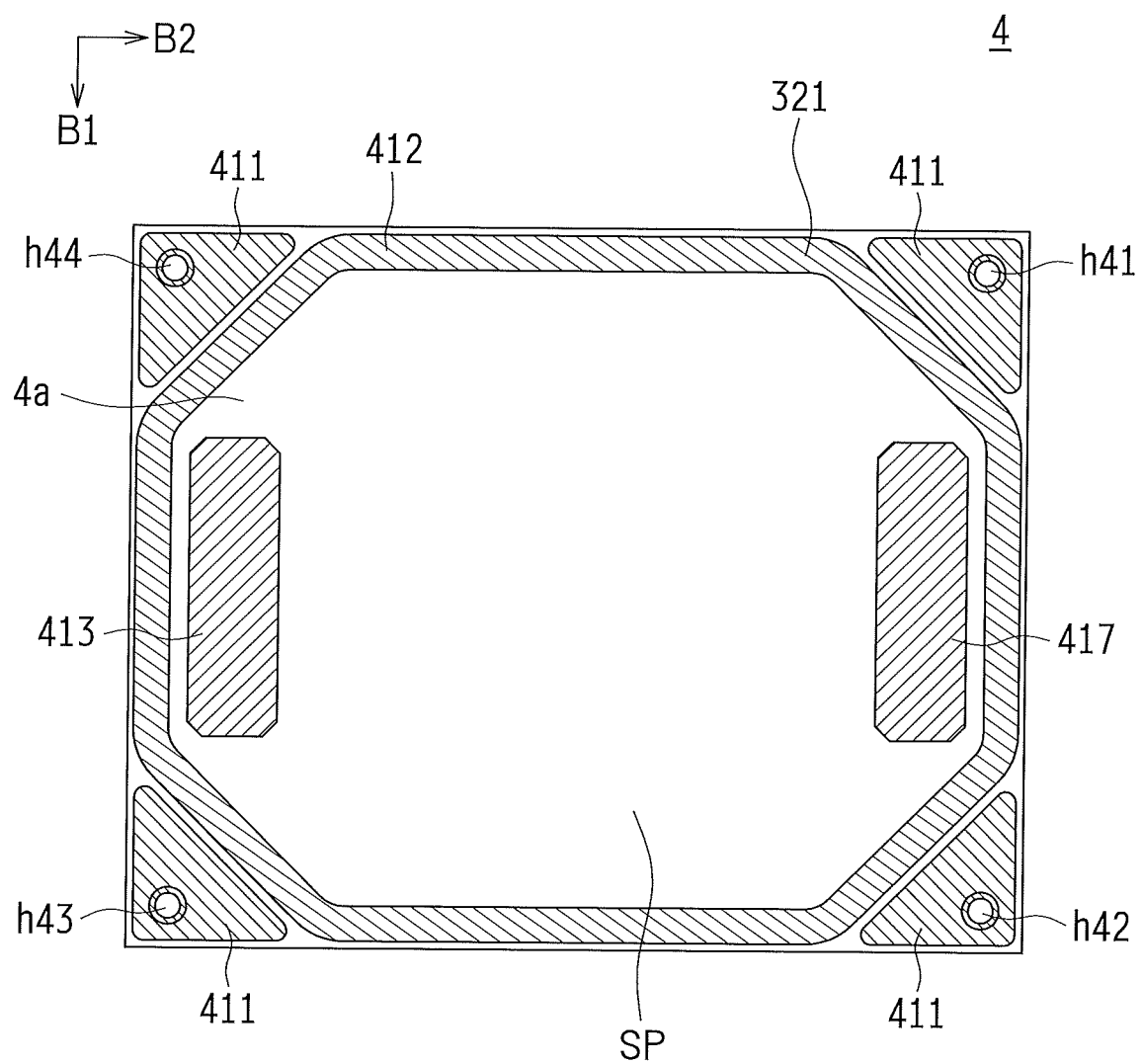
FIG. 19 is a schematic plan view illustrating the variation of the second sealing member of the piezoelectric resonator device.

In the above-described embodiment, the configuration in which two holding parts 22 and 22 are disposed in the piezoelectric substrate 2 of the piezoelectric resonator device was described (see FIGS. 5 to 7). However, only one holding part 22 may be disposed in the piezoelectric substrate 2. The piezoelectric resonator device in this variation will be described with reference to FIGS. 15 to 19. FIG. 15 is a schematic plan view illustrating the variation of the first sealing member 3 of the piezoelectric resonator device, which corresponds to FIG. 3. FIG. 16 is a schematic rear view illustrating the variation of the first sealing member 3 of the piezoelectric resonator device, which corresponds to FIG. 4. FIG. 17 is a schematic plan view illustrating the variation of the piezoelectric substrate 2 of the piezoelectric resonator device, which corresponds to FIG. 5. FIG. 18 is a schematic rear view illustrating the variation of the piezoelectric substrate 2 of the piezoelectric resonator device, which corresponds to FIG. 6. FIG. 19 is a schematic plan view illustrating the variation of the second sealing member 4 of the piezoelectric resonator device, which corresponds to FIG. 8. For convenience sake, the common configuration with the piezoelectric resonator device of the above embodiment (see FIGS. 1 to 9) is indicated by the same reference numerals, and the description thereof is omitted. Hereinafter, a description will be given mainly on the configuration of the piezoelectric resonator device according to this variation, which differs from the configuration of the piezoelectric resonator device of the above embodiment.

As shown in FIGS. 17 and 18, the holding part 22 of the piezoelectric substrate 2 extends (protrudes) from only one corner part 21a that is positioned in the +X and −Z directions of the vibrating part 21 to the external frame part 23 in the −Z direction. Since only one holding part 22 is disposed, a cut-out part 24 is continuously formed so as to surround the outer periphery of the vibrating part 21. Thus, the vibrating part 21 is coupled to the external frame part 23 via only the holding part 22. Note that the above crystal axes and the position of the holding part 22 are shown as an example, they are not particularly limited thereto.

The first extraction electrode 221 extracted from the first excitation electrode 211 is provided on the first main surface of the holding part 22. The second extraction electrode 222 extracted from the second excitation electrode 212 is provided on the second main surface of the holding part 22. The first extraction electrode 221 is connected to the excitation electrode bonding pattern 241 formed on the first main surface of the external frame part 23 via the holding part 22. The second extraction electrode 222 is connected to the excitation electrode bonding pattern 243 formed on the second main surface of the external frame part 23 via the holding part 22. In this variation, only one holding part 22 of the piezoelectric substrate 2 is provided, and the first extraction electrode 221 and the second extraction electrode 222 extend in the same direction (the −Z direction). Therefore, this variation differs from the above-described embodiment in the wiring that connects the first excitation electrode 211 to the external electrode for the first excitation electrode, and in the wiring that connects the second excitation electrode 212 to the external electrode for the second excitation electrode.

In addition to the above-described excitation electrode bonding pattern 241, the excitation electrode bonding patterns 242 and 245 are also formed on the first main surface 2a of the piezoelectric substrate 2. The excitation electrode bonding patterns 242 and 245 are formed on the external frame part 23. The excitation electrode bonding pattern 242 is to apply a voltage to the second excitation electrode 212. In the excitation electrode bonding pattern 242, the eleventh through hole h25 is formed so as to wire the second main surface 2b of the piezoelectric substrate 2. The excitation electrode bonding patterns 241 and 242 are spaced apart from each other by a predetermined distance in the X axis direction. The excitation electrode bonding pattern 245 is located on the opposite side of the excitation electrode bonding patterns 241 and 242 in the Z axis direction, with the vibrating part 21 of the piezoelectric substrate 2 being interposed therebetween. The excitation electrode bonding pattern 245 extends on the external frame part 23 of the piezoelectric substrate 2 in the X axis direction.

On the second main surface 2b of the piezoelectric substrate 2, a bonding pattern 246 is formed in addition to the above-described excitation electrode bonding pattern 243. The excitation electrode bonding pattern 243 and the bonding pattern 246 extend on the external frame part 23 of the piezoelectric substrate 2 in the X axis direction. The excitation electrode bonding pattern 243 is connected to the excitation electrode bonding pattern 242 on the first main surface 2a via the eleventh through hole h25. The bonding pattern 246 is located on the opposite side of the excitation electrode bonding pattern 243 in the Z axis direction, with the vibrating part 21 of the piezoelectric substrate 2 being interposed therebetween.

The eleventh through hole h25, the excitation electrode bonding patterns 241 to 243 and 245, and the bonding pattern 246 are disposed inside the resonator-plate-side first bonding pattern 231 and the resonator-plate-side second bonding pattern 232. The eleventh through hole h25, the excitation electrode bonding patterns 241 to 243 and 245, and the bonding pattern 246 are not electrically connected to the resonator-plate-side first bonding pattern 231 and the resonator-plate-side second bonding pattern 232. In this variation, the resonator-plate-side first bonding pattern 231 and the resonator-plate-side second bonding pattern 232 are each formed so as to have an annular shape in plan view, and more specifically, their outer edges and inner edges each have a substantially octagonal shape. Also, similarly to the above embodiment, the seventh through tenth through holes h21 through h24 and the bonding patterns 251 and 252 are disposed outside the resonator-plate-side first bonding pattern 231 and the resonator-plate-side second bonding pattern 232.

As shown in FIGS. 15 and 16, sealing-member-side excitation electrode bonding patterns 324, 325 and 327 are formed on the second main surface 3b of the first sealing member 3. The sealing-member-side excitation electrode bonding patterns 324 and 327 are respectively conducted to the external electrodes 31 and 31 formed on the first main surface 3a of the first sealing member 3 via the electrodes in the second through hole h32 and the fifth through hole h35.

The sealing-member-side excitation electrode bonding patterns 324 and 325 are to apply a voltage to the first excitation electrode 211. In the sealing-member-side excitation electrode bonding pattern 324, the second through hole h32 is formed so as to wire the first main surface 3a of the first sealing member 3. The sealing-member-side excitation electrode bonding patterns 324 and 325 are respectively connected to the excitation electrode bonding patterns 245 and 241 of the piezoelectric substrate 2. The sealing-member-side excitation electrode bonding pattern 324 extends in the A1 direction, and is integrally formed with a wiring pattern 326. The sealing-member-side excitation electrode bonding pattern 325 is located on the opposite side of the sealing-member-side excitation electrode bonding pattern 324 in the A2 direction with the wiring pattern 326 being interposed therebetween. That is, the sealing-member-side excitation electrode bonding pattern 324 is connected to one end of the wiring pattern 326 in the A2 direction while the sealing-member-side excitation electrode bonding pattern 325 is connected to the other end of the wiring pattern 326 in the A2 direction.

The sealing-member-side excitation electrode bonding pattern 327 is to apply a voltage to the second excitation electrode 212. In the sealing-member-side excitation electrode bonding pattern 327, the fifth through hole h35 is formed so as to wire the first main surface 3a of the first sealing member 3. The sealing-member-side excitation electrode bonding pattern 327 is connected to the excitation electrode bonding pattern 242 of the piezoelectric substrate 2. The sealing-member-side excitation electrode bonding pattern 327 is disposed spaced apart from the sealing-member-side excitation electrode bonding pattern 325 by a predetermined distance in the A1 direction. Also, the sealing-member-side excitation electrode bonding pattern 327 is located on the opposite side of the sealing-member-side excitation electrode bonding pattern 324 in the A2 direction.

The second through hole h32, the fifth through hole h35, the sealing-member-side excitation electrode bonding patterns 324, 325 and 327, and the wiring pattern 326 are disposed inside the sealing-member-side first bonding pattern 321. The second through hole h32, the fifth through hole h35, the sealing-member-side excitation electrode bonding patterns 324, 325 and 327, and the wiring pattern 326 are not electrically connected to the sealing-member-side first bonding pattern 321. In this variation, the sealing-member-side first bonding pattern 321 is formed so as to have an annular shape in plan view, and more specifically, its outer edge and inner edge each have a substantially octagonal shape. Also, similarly to the above embodiment, the first, third, fourth and sixth through holes h31, h33, h34 and h36 are disposed outside the sealing-member-side first bonding pattern 321. Each external electrode 31 is formed at least at a position corresponding to the external frame part 23 of the piezoelectric substrate 2 in plan view, and in this variation, it is formed at a position superimposed to the sealing-member-side first bonding pattern 321 in plan view.

As shown in FIG. 19, the sealing-member-side excitation electrode bonding pattern 413 and a bonding pattern 417 are formed on the first main surface 4a of the second sealing member 4. The sealing-member-side excitation electrode bonding pattern 413 is connected to the excitation electrode bonding pattern 243 of the piezoelectric substrate 2. The bonding pattern 417 is connected to the bonding pattern 246 of the piezoelectric substrate 2. The sealing-member-side excitation electrode bonding pattern 413 and the bonding pattern 417 extend in the B1 direction. The bonding pattern 417 is located on the opposite side of the sealing-member-side excitation electrode bonding pattern 413 in the B2 direction.

The sealing-member-side excitation electrode bonding pattern 413 and the bonding pattern 417 are disposed inside the sealing-member-side second bonding pattern 412. The sealing-member-side excitation electrode bonding pattern 413 and the bonding pattern 417 are not electrically connected to the sealing-member-side second bonding pattern 412. In this variation, the sealing-member-side second bonding pattern 412 is formed so as to have an annular shape in plan view, and more specifically, its outer edge and inner edge each have a substantially octagonal shape. Also, similarly to the above embodiment, the twelfth through fifteenth through holes h41 through h44 and the bonding patterns 411 are disposed outside the sealing-member-side second bonding pattern 412.

In the piezoelectric resonator device according to this variation, similarly to the piezoelectric resonator device of the above-described embodiment, when bonding the first sealing member 3 to the piezoelectric substrate 2, the resonator-plate-side first bonding pattern 231 of the piezoelectric substrate 2 is overlapped with the sealing-member-side first bonding pattern 321 of the first sealing member 3, the excitation electrode bonding patterns 241, 242 and 245 of the piezoelectric substrate 2 are respectively overlapped with the sealing-member-side excitation electrode bonding patterns 325, 327 and 324 of the first sealing member 3, and the bonding patterns 251 of the piezoelectric substrate 2 are respectively overlapped with the bonding patterns 323 of the first sealing member 3. In this way, the respective metals are subjected to diffusion bonding. Also, when bonding the second sealing member 4 to the piezoelectric substrate 2, the resonator-plate-side second bonding pattern 232 of the piezoelectric substrate 2 is overlapped with the sealing-member-side second bonding pattern 412 of the second sealing member 4, the excitation electrode bonding pattern 243 of the piezoelectric substrate 2 is overlapped with the sealing-member-side excitation electrode bonding pattern 413 of the second sealing member 4, and the bonding patterns 246 and 252 of the piezoelectric substrate 2 are respectively overlapped with the bonding patterns 417 and 411 of the second sealing member 4. In this way, the respective metals are subjected to diffusion bonding. The wiring pattern 326 on the second main surface 3b of the first sealing member 3 is not bonded to any patterns on the first main surface 2a of the piezoelectric substrate 2.

With the piezoelectric resonator device according to this variation, it is possible to obtain the functions and effects similar to the piezoelectric resonator device of the above-described embodiment. In contrast, the piezoelectric resonator device according to this variation differs from the piezoelectric resonator device of the above-described embodiment in the following, as described above: the wiring (the first wiring) connecting the first excitation electrode 211 to the external electrode for the first excitation electrode; and the wiring (the second wiring) connecting the second excitation electrode 212 to the external electrode for the second excitation electrode.

Specifically, the wiring (the first wiring) connecting the first excitation electrode 211 to the external electrode for the first excitation electrode includes the first extraction electrode 221, the excitation electrode bonding pattern 241, the sealing-member-side excitation electrode bonding pattern 325, the wiring pattern 326, the sealing-member-side excitation electrode bonding pattern 324, and the second through hole h32. The wiring (the second wiring) connecting the second excitation electrode 212 to the external electrode for the second excitation electrode includes the second extraction electrode 222, the excitation electrode bonding pattern 243, the eleventh through hole h25, the excitation electrode bonding pattern 242, the sealing-member-side excitation electrode bonding pattern 327 and the fifth through hole h35.

Only the bonding material B that connects the external electrode for the first excitation electrode to the external element 5 is disposed at the position superimposed to the wiring (the first wiring) connecting the first excitation electrode 211 to the external electrode for the first excitation electrode in plan view. Also, only the bonding material B that connects the external electrode for the second excitation electrode to the external element 5 is disposed at the position superimposed to the wiring (second wiring) connecting the second excitation electrode 212 to the external electrode for the second excitation electrode in plan view. That is, the bonding materials B and B that are respectively connected to the excitation electrodes (the first excitation electrode 211 and the second excitation electrode 212) are not superimposed, in plan view, to the wirings (the second wiring and the first wiring) respectively connected to the excitation electrodes with different polarity from those connected to the bonding materials B and B (i.e. the second excitation electrode 212 and the first excitation electrode 211). In addition to the above, the bonding materials B that are not connected to the excitation electrodes (the first excitation electrode 211 and the second excitation electrode 212) are not superimposed, in plan view, to the wirings (the first wiring and the second wiring) that are connected to the excitation electrodes. In this way, it is possible to reduce the parasitic capacity caused by superposition of the bonding material B and the wiring that are respectively connected to the excitation electrodes with different polarity, and to reduce the parasitic capacity caused by superposition of the bonding materials B that are not connected to the excitation electrodes and the wirings that are connected to the excitation electrodes.

Among the external electrodes 31, the external electrodes (other external electrodes) that are not connected to the first excitation electrode 211 and the second excitation electrode 212, i.e. the external electrodes 31 other than the external electrodes for the first excitation electrode and for the second excitation electrode, are each disposed at the position not superimposed to the first wiring and the second wiring in plan view. In this way, it is possible to reduce the parasitic capacity caused by superposition of the other external electrodes and the wirings (the first wiring and the second wiring) connected to the excitation electrodes (the first excitation electrode 211 and the second excitation electrode 212). Furthermore, the external electrode for the first excitation electrode is disposed at the position not superimposed to the second wiring in plan view while the external electrode for the second excitation electrode is disposed at the position not superimposed to the first wiring in plan view. In this way, it is possible to reduce the parasitic capacity caused by superposition of the external electrodes (the external electrode for the first excitation electrode and the external electrode for the second excitation electrode) connected to the excitation electrodes (the first excitation electrode and the second excitation electrode) and the wirings (the second wiring and the first wiring) respectively connected to the excitation electrodes with different polarity from those connected to the external electrodes (i.e. the second excitation electrode and the first excitation electrode).

This application claims priority based on Patent Application No. 2015-065972 filed in Japan on Mar. 27, 2015. The entire contents thereof are hereby incorporated in this application by reference.

INDUSTRIAL APPLICABILITY

The present invention is suitable for a crystal resonator device (such as a crystal oscillator) in which a crystal is used as a material for the substrate of the piezoelectric resonator plate.

DESCRIPTION OF REFERENCE NUMERALS

1 Piezoelectric resonator device
2 Piezoelectric substrate
2a First main surface
2b Second main surface
21 Vibrating part
21a Corner part
211 First excitation electrode
212 Second excitation electrode
213 Mesa structure
221 First extraction electrode
222 Second extraction electrode
231 Resonator-plate-side first bonding pattern
232 Resonator-plate-side second bonding pattern
241 Excitation electrode bonding pattern
242 Excitation electrode bonding pattern
243 Excitation electrode bonding pattern
251 Bonding pattern
252 Bonding pattern
22 Holding part
23 External frame part
3 First sealing member
3a First main surface
31 External electrode
3b Second main surface
321 Sealing-member-side first bonding pattern
322 Sealing-member-side excitation electrode bonding pattern
323 Bonding pattern
4 Second sealing member
4a First main surface
4b Second main surface
411 Bonding pattern
412 Sealing-member-side second bonding pattern
413 Sealing-member-side excitation electrode bonding pattern
414 External electrode terminal
5 External element
h31 First through hole
h32 Second through hole
h33 Third through hole
h34 Fourth through hole
h35 Fifth through hole
h36 Sixth through hole
h21 Seventh through hole
h22 Eighth through hole
h23 Ninth through hole
h24 Tenth through hole
h25 Eleventh through hole
h41 Twelfth through hole
h42 Thirteenth through hole
h43 Fourteenth through hole
h44 Fifteenth through hole B Bonding material
SP Internal space
k1 Inversed U-shaped part in plan view
k2 Oblong rectangular part in plan view

The invention claimed is:
1. A piezoelectric resonator device, comprising:
a piezoelectric substrate including a vibrating part configured to piezoelectrically vibrate by application of a voltage and an external frame part thicker than the vibrating part and which surrounds an outer periphery of the vibrating part;
a first sealing member covering a first main surface of the piezoelectric substrate so as to seal the vibrating part;
a second sealing member covering a second main surface of the piezoelectric substrate so as to seal the vibrating part;
a first excitation electrode and a second excitation electrode on the vibrating part of the piezoelectric substrate; and
external electrodes on at least one of the first sealing member and the second sealing member, the external electrodes being connected to an external element, and wherein the external element is connected to the external electrodes at least on the external frame part of the piezoelectric substrate,
wherein a first external electrode is connected to the first excitation electrode and a second external electrode is connected to the second excitation electrode in the absence of castellation,
wherein the external electrodes are connected to the external element via metal bumps,
wherein the external electrodes include at least an external electrode for a first excitation electrode and an external electrode for a second excitation electrode connected respectively to a pair of first excitation electrode and second excitation electrode formed on the vibrating part of the piezoelectric substrate,
wherein only the metal bump connecting the external electrode for the first excitation electrode to the external element is disposed at a position superimposed to a first wiring connecting the first excitation electrode to the external electrode for the first excitation electrode in plan view, and
wherein only the metal bump connecting the external electrode for the second excitation electrode to the external element is disposed at a position superimposed to a wiring connecting the second excitation electrode to the external electrode for the second excitation electrode in plan view.
2. The piezoelectric resonator device according to claim 1,
further comprising other external electrodes not connected to the first excitation electrode and the second excitation electrode, and
wherein the other external electrodes are disposed at positions not superimposed, in plan view, to: a first wiring connecting the first excitation electrode to the external electrode for the first excitation electrode; and a second wiring connecting the second excitation electrode to the external electrode for the second excitation electrode.
3. The piezoelectric resonator device according to claim 2,
wherein the external electrode for the first excitation electrode is disposed at a position not superimposed to the second wiring in plan view, and
wherein the external electrode for the second excitation electrode is disposed at a position not superimposed to the first wiring in plan view.
4. The piezoelectric resonator device according to claim 1,
wherein the external electrode for the first excitation electrode and the external electrode for the second excitation electrode are formed at respective positions corresponding to the external frame part of the piezoelectric substrate in plan view, and
wherein the external electrode for the first excitation electrode and the external electrode for the second excitation electrode are used as test terminals for the vibrating part of the piezoelectric substrate.
5. The piezoelectric resonator device according to claim 1,
wherein the external electrode for the first excitation electrode and the external electrode for the second excitation electrode are formed at respective positions corresponding to the external frame part of the piezoelectric substrate in plan view, and
wherein the external electrode for the first excitation electrode and the external electrode for the second excitation electrode are used as test terminals for the vibrating part of the piezoelectric substrate.
6. The piezoelectric resonator device according to claim 1,
wherein the external electrodes are formed on the first sealing member, and the external element is an IC.
7. A piezoelectric resonator device, comprising:
a piezoelectric substrate including a vibrating part configured to piezoelectrically vibrate by application of a voltage;
a first sealing member covering a first main surface of the piezoelectric substrate so as to seal the vibrating part; and
a second sealing member covering a second main surface of the piezoelectric substrate so as to seal the vibrating part,
the piezoelectric resonator device being configured to seal at least the vibrating part of the piezoelectric substrate by the first sealing member and the second sealing member,
wherein the piezoelectric substrate includes: the vibrating part; and an external frame part configured to be thicker than the vibrating part and to surround an outer periphery of the vibrating part, wherein external electrodes are provided on at least one of the first sealing member and the second sealing member, the external electrodes being connected to an external element via metal bumps at least on the external frame part of the piezoelectric substrate,
wherein the external electrodes include at least an external electrode for a first excitation electrode and an external electrode for a second excitation electrode connected respectively to a pair of first excitation electrode and second excitation electrode formed on the vibrating part of the piezoelectric substrate,
wherein only the metal bump connecting the external electrode for the first excitation electrode to the external element is disposed at a position superimposed to a first wiring connecting the first excitation electrode to the external electrode for the first excitation electrode in plan view, and
wherein only the metal bump connecting the external electrode for the second excitation electrode to the external element is disposed at a position superimposed to a wiring connecting the second excitation electrode to the external electrode for the second excitation electrode in plan view.

8. A piezoelectric resonator device, comprising:

a piezoelectric substrate including a vibrating part configured to piezoelectrically vibrate by application of a voltage;

a first sealing member covering a first main surface of the piezoelectric substrate so as to seal the vibrating part; and a second sealing member covering a second main surface of the piezoelectric substrate so as to seal the vibrating part, the piezoelectric resonator device being configured to seal at least the vibrating part of the piezoelectric substrate by the first sealing member and the second sealing member, wherein the piezoelectric substrate includes: the vibrating part; and an external frame part configured to be thicker than the vibrating part and to surround an outer periphery of the vibrating part, wherein external electrodes are provided on at least one of the first sealing member and the second sealing member, the external electrodes being connected to an external element, and wherein the external element is connected to the external electrodes at least on the external frame part of the piezoelectric substrate, and wherein the external electrodes include, at least: an external electrode for a first excitation electrode and an external electrode for a second excitation electrode connected respectively to a pair of first excitation electrode and second excitation electrode formed on the vibrating part of the piezoelectric substrate; and other electrodes not connected to the first excitation electrode and the second excitation electrode, and wherein the other external electrodes are disposed at positions not superimposed, in plan view, to: a first wiring connecting the first excitation electrode to the external electrode for the first excitation electrode; and a second wiring connecting the second excitation electrode to the external electrode for the second excitation electrode.

9. The piezoelectric resonator device according to claim 8, wherein the external electrode for the first excitation electrode is disposed at a position not superimposed to the second wiring in plan view, and wherein the external electrode for the second excitation electrode is disposed at a position not superimposed to the first wiring in plan view.

10. The piezoelectric resonator device according to claim 7, wherein the external electrode for the first excitation electrode and the external electrode for the second excitation electrode are formed at respective positions corresponding to the external frame part of the piezoelectric substrate in plan view, and wherein the external electrode for the first excitation electrode and the external electrode for the second excitation electrode are used as test terminals for the vibrating part of the piezoelectric substrate.

11. The piezoelectric resonator device according to claim 1, wherein the first external electrode and the second external electrode are connected to the first excitation electrode and the second external electrode respectively via holes that are not at the edges of the first sealing member and second sealing member.

12. The piezoelectric resonator device according to claim 11, wherein the holes are perpendicular to the first and second sealing members.

* * * * *